(12) United States Patent
Rachmady et al.

(10) Patent No.: US 11,398,479 B2
(45) Date of Patent: Jul. 26, 2022

(54) HETEROGENEOUS GE/III-V CMOS TRANSISTOR STRUCTURES

(71) Applicant: INTEL CORPORATION, Santa Clara, CA (US)

(72) Inventors: Willy Rachmady, Beaverton, OR (US); Abhishek A. Sharma, Hillsboro, OR (US); Ravi Pillarisetty, Portland, OR (US); Patrick Morrow, Portland, OR (US); Rishabh Mehandru, Portland, OR (US); Aaron D. Lilak, Beaverton, OR (US); Gilbert Dewey, Beaverton, OR (US); Cheng-Ying Huang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 73 days.

(21) Appl. No.: 16/649,799

(22) PCT Filed: Dec. 29, 2017

(86) PCT No.: PCT/US2017/068448
§ 371 (c)(1),
(2) Date: Mar. 23, 2020

(87) PCT Pub. No.: WO2019/132865
PCT Pub. Date: Jul. 4, 2019

(65) Prior Publication Data
US 2020/0312846 A1 Oct. 1, 2020

(51) Int. Cl.
*H01L 27/092* (2006.01)
*H01L 29/06* (2006.01)
(Continued)

(52) U.S. Cl.
CPC ...... *H01L 27/0924* (2013.01); *H01L 29/0669* (2013.01); *H01L 29/20* (2013.01);
(Continued)

(58) Field of Classification Search
CPC ..... H01L 21/823821; H01L 21/823431; H01L 21/02532; H01L 21/823807;
(Continued)

(56) References Cited

U.S. PATENT DOCUMENTS 9,536,900 B2 * 1/2017 Ramachandran ... H01L 29/1054
9,728,464 B2 * 8/2017 Glass .............. H01L 21/823814
(Continued)

FOREIGN PATENT DOCUMENTS

KR 1020150096023 A 8/2015
WO WO-2016200402 A1 * 12/2016 ....... H01L 21/02532
(Continued)

OTHER PUBLICATIONS

Lee et al., "Fabrication and characterization of germanium-on-insulator through epitaxy, bonding, and layer transfer," Journal of Applied Physics 116, 103506 (2014) (5 pages).
(Continued)

*Primary Examiner* — Errol V Fernandes
*Assistant Examiner* — Jeremy J Joy
(74) *Attorney, Agent, or Firm* — Schwabe, Williamson & Wyatt, P.C.

(57) ABSTRACT

An integrated circuit includes: a germanium-containing fin structure above a layer of insulation material; a group III-V semiconductor material containing fin structure above the layer of insulation material; a first gate structure on a portion of the germanium-containing fin structure; a second gate structure on a portion of the group III-V semiconductor material containing fin structure; a first S/D region above the layer of insulation material and laterally adjacent to the
(Continued)

portion of the germanium-containing fin structure, the first S/D region comprising a p-type impurity and at least one of silicon or germanium; a second S/D region above the layer of insulation material and laterally adjacent to the portion of the group III-V semiconductor material containing fin structure, the second S/D region comprising an n-type impurity and a second group III-V semiconductor material; and a layer comprising germanium between the layer of insulation material and the second S/D region.

19 Claims, 13 Drawing Sheets

(51) Int. Cl.
  *H01L 29/20* (2006.01)
  *H01L 29/417* (2006.01)
  *H01L 29/66* (2006.01)
  *H01L 29/78* (2006.01)
(52) U.S. Cl.
  CPC .... *H01L 29/41791* (2013.01); *H01L 29/6681* (2013.01); *H01L 2029/7858* (2013.01)
(58) Field of Classification Search
  CPC ......... H01L 21/823412; H01L 27/0924; H01L 27/0886; H01L 27/1211; H01L 29/66795; H01L 29/785; H01L 29/20–2006; H01L 29/66522; H01L 29/66545; H01L 29/42392; H01L 29/0673; H01L 29/78696; H01L 29/66439; H01L 29/775
  See application file for complete search history.

(56) References Cited

U.S. PATENT DOCUMENTS

| | | | | |
|---|---|---|---|---|
| 2006/0172505 A1* | 8/2006 | Koester | ........... | H01L 21/823807 438/455 |
| 2011/0068407 A1* | 3/2011 | Yeh | ..................... | H01L 21/8256 257/369 |
| 2011/0108920 A1* | 5/2011 | Basker | ................ | H01L 29/1054 257/E29.151 |
| 2013/0153964 A1* | 6/2013 | Guo | .................... | H01L 21/8258 257/E21.632 |
| 2013/0168771 A1* | 7/2013 | Wu | ..................... | H01L 29/1054 257/E21.632 |
| 2013/0270512 A1* | 10/2013 | Radosavljevic | ...... | H01L 29/775 438/212 |
| 2013/0320294 A1* | 12/2013 | Cappellani | .......... | H01L 29/0649 257/627 |
| 2014/0339638 A1* | 11/2014 | Cheng | ................ | H01L 27/1203 438/154 |
| 2015/0318216 A1* | 11/2015 | Cheng | ............... | H01L 21/31051 438/221 |
| 2015/0340490 A1* | 11/2015 | An | .................... | H01L 29/66545 257/401 |
| 2016/0013186 A1* | 1/2016 | Bae | ..................... | H01L 29/0673 257/288 |
| 2016/0190239 A1* | 6/2016 | Suk | ........................ | H01L 29/495 257/351 |
| 2016/0343623 A1 | 11/2016 | Fogel et al. | | |
| 2016/0379881 A1 | 12/2016 | He et al. | | |
| 2017/0011969 A1* | 1/2017 | Leobandung | ....... | H01L 27/0924 |
| 2017/0162447 A1* | 6/2017 | Glass | .................... | H01L 29/165 |
| 2018/0108750 A1* | 4/2018 | Glass | ................. | H01L 21/8256 |
| 2018/0158927 A1* | 6/2018 | Mohapatra | .............. | H01L 29/78 |
| 2018/0323264 A1* | 11/2018 | Le | ..................... | H01L 21/76802 |

FOREIGN PATENT DOCUMENTS

| | | | | |
|---|---|---|---|---|
| WO | WO-2016209220 A1 * | 12/2016 | ....... | H01L 21/02532 |
| WO | WO-2016209285 A1 * | 12/2016 | ............ | B82Y 10/00 |
| WO | 2019132865 A1 | 7/2019 | | |

OTHER PUBLICATIONS

Goley, Patrick S. and Hudait, Mantu K., "Germanium Based Field-Effect Transistors: Challenges and Opportunities," Materials 7, 2301-2339 (2014) (39 pages).
Cheng et al., "Relaxed silicon-germanium on insulator substrate by layer transfer," Journal of Electronic Materials, vol. 30, No. 12 (2001) (3 pages).
International Search Report and Written Opinion, PCT Application No. PCT/US2017/068448 (dated Sep. 21, 2018) (14 pages).
International Preliminary Report on Patentability, PCT Application No. PCT/US2017/068448 (dated Jul. 9, 2020) (11 pages).

* cited by examiner

HETEROGENEOUS GE/III-V CMOS TRANSISTOR STRUCTURES

CROSS-REFERENCE TO RELATED APPLICATIONS

This patent application is a U.S. National Phase Application under 35 U.S.C. § 371 of International Application No. PCT/US2017/068448, filed on Dec. 29, 2017, the entire contents of which is hereby incorporated by reference herein.

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material generally referred to as a fin. Because the conductive channel of such configurations includes three different planer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor, sometimes referred to as a gate-all-around (GAA) or nanoribbon transistor, is configured similarly to a fin-based transistor, but instead of a finned channel region, it has one or more nanowires used for the channel region and the gate material generally surrounds or encircles each nanowire (hence, gate-all-around).

Figure 1:
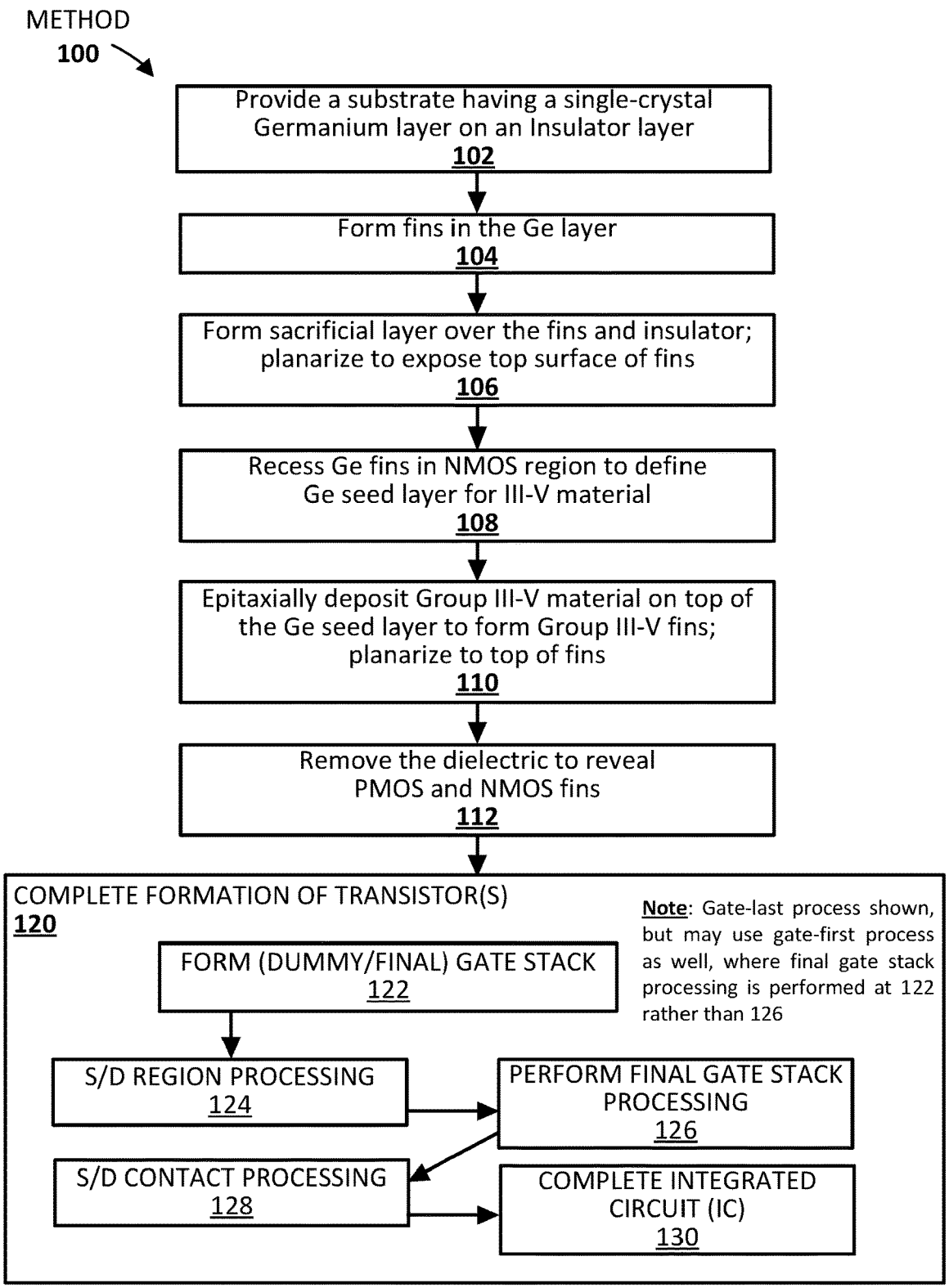
FIG. 1 is a flow chart showing processes in a method of forming an integrated circuit having both a single-crystal germanium channel region and a single-crystal III-V material channel region in the same device layer, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Transistor structures are disclosed that include heterogeneous integration of diverse high mobility channel materials on a common substrate. In an embodiment, a CMOS structure comprises germanium PMOS transistors and group III-V NMOS transistors on insulator. The group III-V material can be, for example, gallium arsenide (GaAs), indium gallium arsenide (InGaAs), or indium phosphide (InP), to name a few examples. In some embodiments, the germanium transistor is formed from a layer of transferred germanium, and the III-V transistor is formed by growing III-V material in an aspect ratio trapping trench with germanium as an epitaxial seed layer. As will be appreciated in light of this disclosure, the disclosed techniques enable fabrication of high performance CMOS integrated circuits, by avoiding defect formation due to crystal lattice mismatch when germanium and III-V material are grown directly on a silicon substrate.

General Overview

With the semiconductor industry utilizing CMOS circuitry for a multitude of applications, where CMOS circuitry includes both NMOS and PMOS devices, various issues arise in the co-integration of the NMOS and PMOS devices. For instance, when monolithically integrating NMOS and PMOS devices using the same substrate, forming high performance versions of both devices can be difficult. In general, NMOS and PMOS devices perform better with relatively different semiconductor materials. For instance, in the context of forming transistor devices with high-mobility channel materials, germanium (Ge)-rich material (e.g., Ge or silicon germanium with high Ge content) is preferred for p-channel transistors (PMOS devices) as Ge-rich material enables relatively high hole mobility, whereas group III-V semiconductor material (e.g., gallium arsenide, indium gallium arsenide, etc.) is preferred for n-channel transistors (NMOS devices) as group III-V semiconductor material enables relatively high electron mobility. However, it is difficult to effectively co-integrate such dissimilar semiconductor materials for use in transistor channels on a common substrate, because it is difficult to form the different semiconductor materials in a suitably defect-free manner given the diverse lattice constants of the materials involved (e.g., due to the lattice mismatch between the substrate and at least one of the two channel materials to be co-integrated). Such defects reduce performance of the device. The issue of effectively co-integrating compositionally different semiconductor material that is substantially defect-free is particularly challenging when trying to maintain compatibility with conventional CMOS process flows. This issue is further exacerbated when the transistor devices being formed are scaled down to relatively small critical dimensions (e.g., where transistor lateral gate lengths are sub-30 nm, or sub-20 nm, or sub-10 nm, etc). One possible solution is growing germanium and III-V material directly on silicon inside narrow trenches so that most of defects generated from the lattice mismatch are terminated at the trench sidewalls, and thereby prevented them from propagating up to device region. This approach is generally referred to as aspect ratio trapping (ART). However, this approach only terminates defects that propagate diagonally across the trench width and not along the trench length or vertically along the trench height.

Thus, and in accordance with numerous embodiments of the present disclosure, techniques are provided for co-integrating compositionally different semiconductor materials using a common monocrystalline semiconductor layer. As will be appreciated, the compositionally different semiconductor materials can be used to provide diverse transistor channels having desired performance qualities, such as high mobility for the given carrier (e.g., holes for PMOS and electrons for NMOS). In some embodiments, the monocrystalline (or single crystal) semiconductor layer is formed into a set of a first type of fins (e.g., germanium or germanium-rich fins). Some of these first type fins are subsequently recessed and used as a relatively thin seed layer that allows forming of a set of a second type of fins (e.g., group III-V material fins). As will be appreciated, the seed layer provided by the first fin allows an overlying epitaxial monocrystalline semiconductor material for the second fin type to be formed in a defect-free or substantially defect-free manner. In some embodiments, the seed layer is sufficiently thin (e.g., less than 20 nm, such as in the range of 2 to 15 nm, or 2 to 10 nm, or 2 to 5 nm) such that it allows itself to be strained by the overlying semiconductor material during epitaxial growth of that material. This self-strain effect is referred to as strain transfer or compliant effect. As a result, misfit dislocations that would otherwise be present due to lattice mismatch between the monocrystalline semiconductor seed layer material and the overlying epitaxial semiconductor material may not form (or may otherwise form at a lower rate/quantity), thereby enabling that overlying semiconductor material (for the second fin type) to be formed with relatively high quality or suitable device quality, in accordance with some embodiments. Note, however, in other example embodiments of the present disclosure, such as those having a relatively thick germanium seed layer (e.g., greater than 20 nm), the strain transfer or compliant effect may not occur (or may not fully occur). As such, the overlying semiconductor material for the second fin type may be formed with a relatively higher number defects (e.g., misfit dislocations) than would otherwise be formed with a thinner seed layer. Such a result may be acceptable for some applications.

According to some embodiments, a first set of germanium fins are formed, and some of those germanium fins are recessed to provide a relatively thin germanium seed layer upon which a second set of group III-V material fins are subsequently formed. The germanium fins can be used for PMOS transistor devices, while the III-V material fins can be used for NMOS transistor devices. As will be appreciated in light of this disclosure, the relatively thin seed layer can be used to provide a suitable growth surface for a multitude of different semiconductor materials while preventing or otherwise reducing misfit dislocations (and/or other defects) that would otherwise be present without using such a thin seed layer, thereby enabling the monolithic co-integration of compositionally different and defect-free (or substantially defect-free) semiconductor materials for a single integrated circuit (IC).

In some embodiments, the thickness of the seed layer may be determined based on the semiconductor material included in the seed layer and/or the overlying material formed on the seed layer, as different semiconductor material may exhibit strain transfer or compliant effect up to different maximum thicknesses. In some embodiments, the seed layer may include a thickness (e.g., the dimension between the overlying monocrystalline material and the underlying material) in the range that will allow the seed layer itself to be strained by epitaxial growth of diverse semiconductor material thereon, as will be apparent in light of this disclosure. In some embodiments, the seed layer may include a thickness of less than 20, 15, 10, 8, 5, 4, 3, or 2 nm. In a more general sense, the seed layer may include a thickness of less than any suitable threshold value that will allow the seed layer itself to be strained by epitaxial growth of diverse semiconductor material thereon. In some embodiments, it may be desired to form the seed layer in a relatively thin manner, such as with a thickness in the range of 1-5 nm (e.g., 2-4 nm), so that it does not significantly contribute to conduction or other parasitic effects, for example.

In some embodiments, the germanium (or germanium-rich) layer used to make the germanium fins (and seed layer) may be provided by a layer transfer process. For instance, the germanium layer can be formed on a separate substrate suitable for growing single crystal germanium. The germanium layer can then be transferred to a silicon substrate using silicon dioxide ($SiO_2$) as a bonding agent, thereby providing a germanium on insulator structure. Further, such a structure including a layer of oxide or other electrically insulating material generally provides enhanced isolation for transistors formed above that layer, as compared to structures lacking that electrically insulating layer. As used herein, a "germanium-rich layer" is a layer comprising more than 50 atomic percent germanium, and in some embodiments, is a layer comprising at least 80 atomic percent germanium.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Group III may also be known as the boron group or IUPAC group 13, group IV may also be known as the carbon group or IUPAC group 14, and group V may also be known as the nitrogen family or IUPAC group 15.

"Virtually defect-free" as used herein with respect to semiconductor material or a feature/layer/structure including semiconductor material means having a defect density no greater than $1E6$ $cm^{-2}$. "Substantially defect-free" as used herein with respect to semiconductor material or a feature/layer/structure including semiconductor material means having no more than 1 or 2 misfit dislocations per the material or the feature/layer/structure.

Note also that the term "compositionally different" as used herein with respect to semiconductor materials or features/layers/structures including semiconductor material means (at least) including different semiconductor materials or including the same semiconductor material but with a different compositional ratio (e.g., where the concentration of at least one component of the material is different). For instance, Ge is compositionally different than InGaAs (as they are different semiconductor materials), but $Si_{0.7}Ge_{0.3}$ is also compositionally different than $Si_{0.4}Ge_{0.6}$ (as they include different compositional ratios). The same applies to layers that are said to be "distinct" from one another.

In some embodiments, a plurality of channel layers of different channel materials may be formed on different areas of the substrate, such as for CMOS applications. For instance, a first channel material layer may be formed on a first area of a silicon base to be used for one or more p-channel transistor devices (e.g., one or more PMOS devices having germanium channel regions) and a second channel material layer may be formed on a second area of the silicon base to be used for one or more n-channel transistor devices (e.g., one or more NMOS devices having group III-V material channel regions).

In some embodiments, the techniques described herein can be used to benefit n-channel devices (e.g., NMOS) and/or p-channel devices (e.g., PMOS). Further, in some embodiments, the techniques described herein can be used to form complementary transistor circuits (such as CMOS circuits), where the techniques can be used to benefit one or more of the included n-channel and p-channel transistors making up the CMOS circuit. Further still, in some embodiments, in some embodiments, the techniques described herein can be used to benefit a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof, to provide a few examples. In addition, in some embodiments, the techniques can be used with a variety of source/drain (S/D) configurations, such as replacement material S/D, cladded S/D, raised S/D, and/or any other suitable S/D configuration as will be apparent in light of this disclosure. The techniques described herein may be used to benefit any number of integrated circuits, such as logic transistor devices and input/output (I/O) transistor devices, or any other transistor-based devices used for any number of applications (e.g., amplification, switching, etc.). In a more general sense, the techniques described herein can be used to benefit a multitude of transistor devices, and allow transistors to be further scaled with diverse channel materials.

As used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as electron microscopy, including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. Such tools can be used to indicate, for example, an integrated circuit having compositionally diverse, high quality, high mobility, channel regions, in accordance with various embodiments of the present disclosure. For example, TEM can be useful to show a cross section of a device structure. In another example, x-ray crystallography can be useful to illustrate the crystal quality of the active channel material. In some embodiments, the techniques described herein may be detected based on the benefits derived from their use, which includes channel materials with improved crystal structure, improved carrier mobility, relatively higher operating voltage, and/or relatively higher drive currents, according to some embodiments. Numerous configurations and variations will be apparent in light of this disclosure.

Architecture and Methodology

An aspect of the present disclosure relates to methodologies for making transistor structures. FIG. 1 illustrates an example method 100 of forming an integrated circuit with one or more germanium fins for PMOS devices and one or more fins of III-V material for NMOS devices, in accordance with some embodiments of the present disclosure. FIG. 1 will be referenced in combination with FIGS. 2-14, which illustrate example IC structures formed when carrying out method 100 of FIG. 1, in accordance with some embodiments of the present disclosure. Note that the techniques and structures described herein are primarily depicted and described in the context of forming finned transistor or so-called FinFET configurations (e.g., tri-gate and double-gate transistor configurations) as well as nanowire or nanoribbon configurations (or so-called gate-all-around configurations). However, in some embodiments, the techniques may be used to form planar transistors, as will be apparent in light of this disclosure. Also, note that the techniques may be used with either a gate-first process flow or a gate-last process flow (or so-called replacement gate process flow). Numerous variations and configurations will be apparent in light of this disclosure.

Figure 2A:
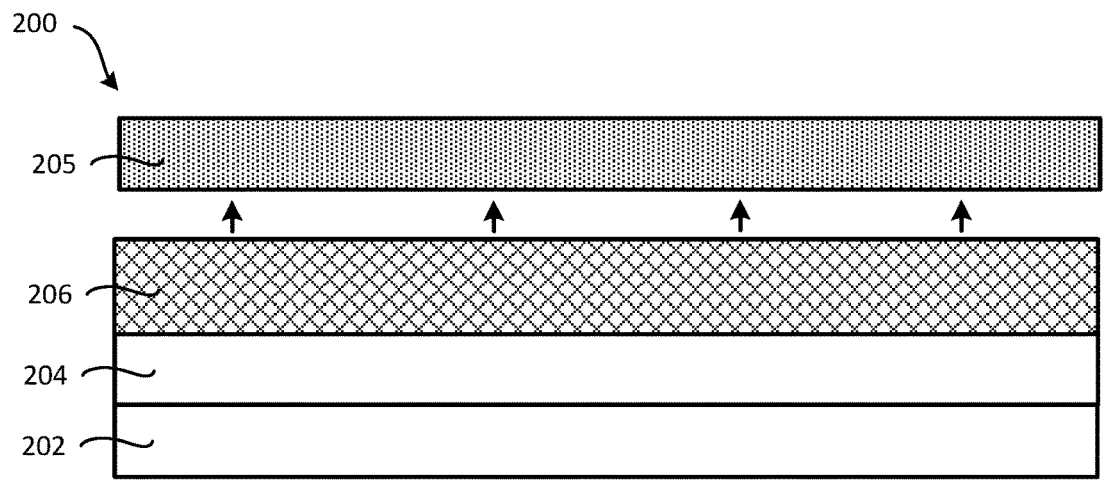
FIG. 2A illustrates an example structure showing a bonding and liftoff process used for transferring a germanium layer to a substrate wafer, in accordance with some embodiments of the present disclosure.
Figure 2B:
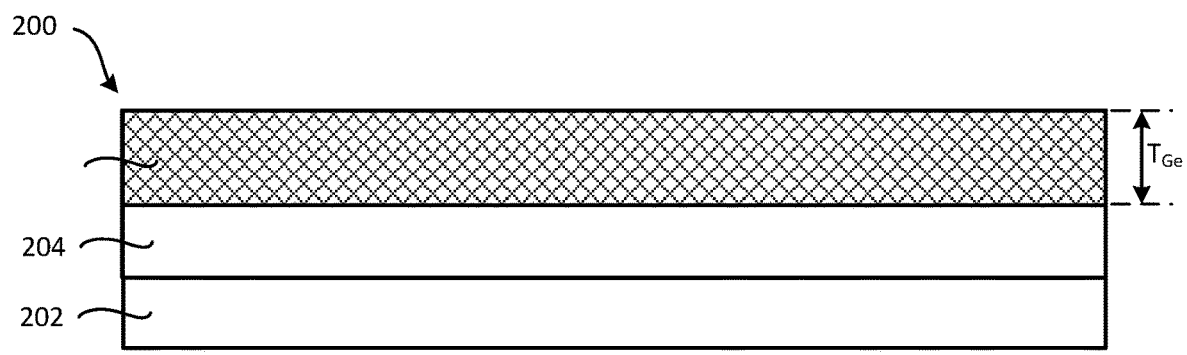
FIG. 2B illustrates a germanium layer on an oxidized semiconductor substrate after completing the liftoff process, in accordance with some embodiments of the present disclosure.

Referring to FIGS. 1 and 2A-2B, method 100 includes providing 102 a multilayer substrate 200 with a base semiconductor layer 202, an insulator layer 204 on base semiconductor layer 202, and a germanium layer 206 directly on insulator layer 204.

In some embodiments, providing 102 multilayer substrate 200 includes forming multilayer substrate 200 by transferring a germanium layer onto an oxidized semiconductor substrate. For example, a single-crystal germanium layer 206 can be grown on a silicon donor wafer 205 using ultrahigh vacuum chemical vapor deposition or some other suitable deposition process. The single-crystal germanium layer 206 can then be transferred onto an oxidized Si handle wafer (or other base layer) 202 by any suitable wafer bonding and cleaving techniques. For example, the bonding step can be performed by placing the germanium layer 206 in contact with the oxidized surface 204 of the Si handle wafer 202 and annealing at a temperature of 350° C. In some cases, pressure is applied to the wafers during annealing. The Si donor wafer 205 can be removed from the germanium layer 206 with a hydrogen implantation process that separates the Si donor wafer 205 from the germanium layer 206, thereby leaving the thin germanium film 206 on the silicon dioxide ($SiO_2$) insulator layer 204 of the handle wafer or substrate (base layer) 202. In another example, a germanium epitaxial film can be grown directly on a silicon (Si 001) donor wafer 205 using a three-step growth approach in a low pressure chemical vapor deposition process. The germanium epilayer 206 is then bonded via an oxide layer 204 to a Si (001) handle wafer 202 to form the GeOI substrate 200. The donor wafer 205 is then lifted off or otherwise removed, leaving the Ge epilayer 206 on the oxide layer 204 of the Si handle wafer 202. In still other embodiments, GeOI structure can simply be purchased (rather than formed). In any such configurations, note that misfit dislocations of the Ge layer 200 of structure 200 can be removed by chemical mechanical polishing (CMP) and/or by annealing to provide a Ge epilayer with low threading dislocations density level and low surface roughness.

In some embodiments, substrate base 202 is a bulk silicon substrate or wafer, such as monocrystalline silicon or a silicon wafer sliced from a boule, or commercially available bulk silicon substrate. In other embodiments, substrate base 202 can be any suitable semiconductor material, such silicon, germanium, silicon germanium, silicon carbide (SiC), gallium nitride (GaN), and gallium arsenide (GaAs), to name a few examples. In still other embodiments, substrate base 202 can be a semiconductor layer deposited or grown on a growth substrate, such as silicon carbide layer epitaxially grown on sapphire. In another example, substrate base 202 includes a silicon-germanium epitaxial layer grown on silicon. In a more general sense, substrate base 202 can be any suitable structure or material(s) upon which layers 204 and 206 can be carried, as will be apparent.

Insulator layer 204 may include one or more oxides (e.g., silicon dioxide, aluminum oxide), nitrides (e.g., silicon nitride), dielectrics (e.g., high-k or low-k dielectrics), and/or any other suitable electrically insulating material as will be apparent. In some embodiments, insulator layer 204 is a native oxide of the underlying substrate base 202 (e.g., such as the example case where 202 is a bulk silicon substrate and 204 is a layer of silicon dioxide). As will be further appreciated, insulator layer 204 may include any suitable thickness (dimension in the Y-axis direction), such as a thickness in the range of 10 nm to 3 microns (or in the sub-range of 50 nm to 1 micron), for example, or any other suitable thickness value or range as will be apparent in light of this disclosure. In some embodiments, insulator layer 204 may include a multilayer structure including two or more distinct layers. In some embodiments, insulator layer 204 may include grading (e.g., increasing and/or decreasing) of one or more material concentrations throughout at least a portion of the insulator layer 204.

In some embodiments, germanium layer 206 comprises single-crystal germanium, although in other embodiments layer 206 is a germanium-rich layer having a germanium concentration in excess of 50 atomic percent, or 75 atomic percent, or 90 atomic percent. To this end, layer 206 need not be 100 atomic percent germanium. In a more general sense, layer 206 can be any germanium-containing layer suitable for providing a PMOS channel region, and further suitable for providing a seed layer on which to grow high quality III-V material, as will be appreciated in light of this disclosure. Note that germanium layer 206 may or may not be doped. In some embodiments, germanium layer 206 can have a layer thickness $T_{Ge}$ from, for example, 10 nm to 300 nm, such as 10 to 50 nm, or 50 to 100 nm, or 100 to 150 nm, or 150 to 200 nm, or 100 to 200 nm. As will be further appreciated in light of this disclosure, note that the thickness $T_{Ge}$ of layer 206 can be set based on the desired height of the germanium channel region to be formed from that layer. Further note that thickness $T_{Ge}$ is not to be confused with the thickness of the germanium seed layer 208, which will be discussed in turn but in general is less that thickness $T_{Ge}$.

In some embodiments, germanium layer 206 comprises virtually defect-free, single-crystal germanium. That is, germanium layer 206 contains fewer than 1E6 defects per $cm^2$, which in some cases is the resolution limit of TEM analysis. Thus, a defect density less than 1E6 $cm^{-2}$ results in no visible defects as viewed using TEM. In other embodiments, germanium layer 206 exhibits a carrier mobility of at least 400 $cm^2/Vs$, such as at least 500 $cm^2/Vs$, or at least 600 $cm^2/Vs$, or at least 700 $cm^2/Vs$, or at least 800 $cm^2/Vs$. In some embodiments, germanium layer 206 exhibits a combination of a desired defect density and a minimum carrier mobility, such as any combination of the example values discussed above.

Figure 3A:
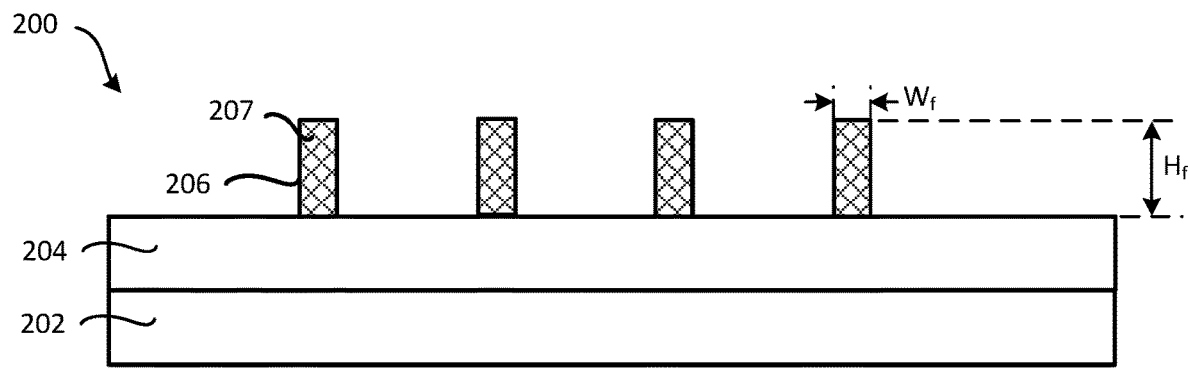
FIGS. 3A and 3B illustrate cross-sectional and perspective views, respectively, of an example structure after forming fins from the germanium layer, in accordance with some embodiments of the present disclosure.
Figure 3B:
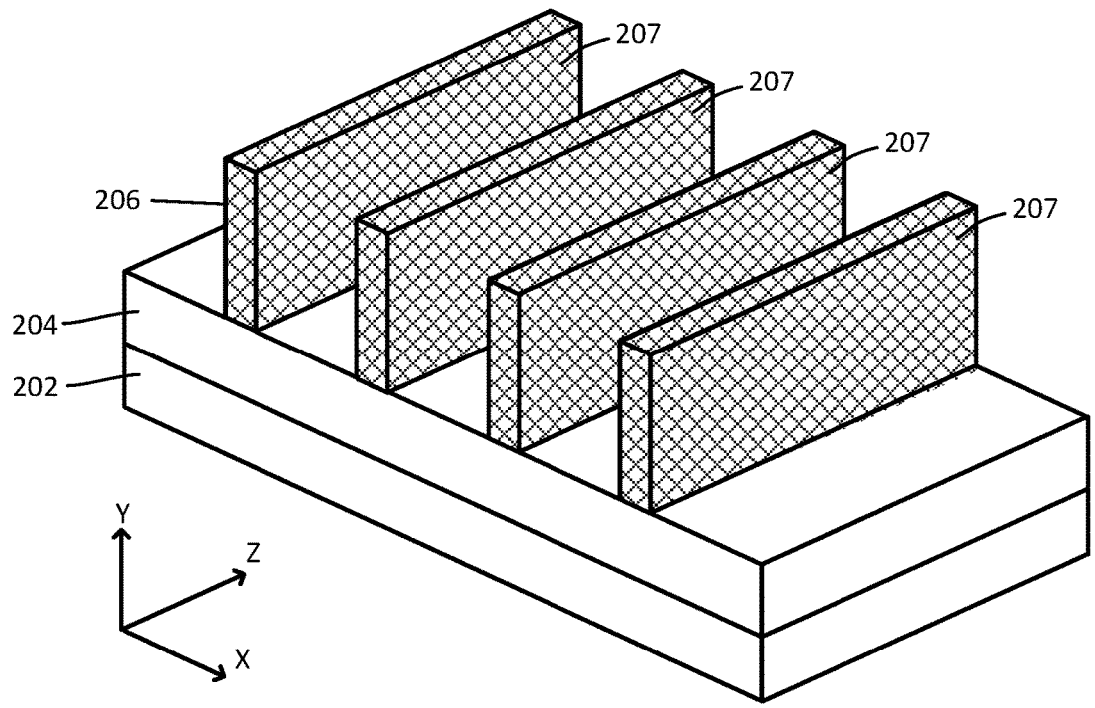

Referring now to FIGS. 3A-3B, method 100 of FIG. 1 continues with forming 104 one or more germanium fins 207 from germanium layer 206 as depicted in the example structure. Forming 104 germanium fins 207 can be performed using any suitable techniques, including one or more of masking, patterning, lithography, and/or etching processes (e.g., wet and/or dry etching). For example, in one embodiment, forming 104 germanium fins 207 includes depositing and patterning a hard mask layer on germanium layer 206 to block locations where germanium fins 207 are desired. Subsequently, the unmasked portions of germanium layer 206 are recessed down to the underlying insulator layer 204 to result in germanium fins 207 extending upward from insulator layer 204. Note in some such cases, the insulator layer 204 acts as an etch stop.

In some embodiments, each germanium fin 207 can have a vertical fin height $H_f$ (dimension in the Y-axis direction) similar to the thickness of the original layer 206. As can be further seen, each fin has a horizontal fin width $W_f$ (dimension in the X-axis direction). In some example embodiments, fin width $W_f$ is in the range of 2 nm-400 nm (or in any subrange thereof, such as 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm). While in non-planar transistor configurations, fin width $W_f$ will likely be smaller (e.g., less than 50 nm), in planar transistor configurations fin width $W_f$ may be much larger (where the transistor is effectively built on the top of a relatively wide fin). In some embodiments, the ratio of fin height to fin width ($H_f:W_f$) is greater than 1, such as greater than 1.5, 2, 2.5, 3, 3.5, 4, 4.5, 5, 6, 7, 8, 9, 10, or 20, or higher. Further, in some embodiments, germanium fins 207 can be formed to include fins of different fin heights $H_f$, different fin widths $W_f$, different vertical starting points (location in the Y-axis direction), different shapes, and/or any other suitable variation(s) as will be apparent in light of this disclosure. For example, in some embodiments, germanium fins 207 may be formed to have varying fin heights $H_f$ and/or varying fin widths $W_f$ that may correspond to (or be the same as) the final desired fin heights $H_f$ and fin widths $W_f$ described in more detail below. In addition, while the fins are shown as having perfectly vertical sidewalls, in other embodiments the sidewalls may be tapered such that width $W_f$ at the top of a given fin is smaller than width $W_f$ at the bottom or midpoint of that fin, or may otherwise be less than perfectly vertical. In a more general sense, the fins may have any number of cross-sectional shapes and profiles and may further have any suitable values/ranges/thresholds of fin height $H_f$, fin width $W_f$, and the ratio or fin height to fin width, as will be further apparent in light of this disclosure.

Note that although each germanium fin 207 shown in FIGS. 3A-3B (of which there are four shown) are illustrated as having the same sizes and shapes relative to one another, the present disclosure is not so limited. Germanium fins 207 are shown for ease of illustration in FIGS. 3A-3B as having a fin height $H_f$ that is somewhat greater than the thicknesses of insulator layer 204 and substrate base 202. However, in some embodiments, the fin height $H_f$ may be less than (e.g., ½ to ¹⁄₁₀ or a smaller fraction of) the overall thickness of substrate base 202 and insulator layer 204, for example. Also, while four fins are shown in the example structures of FIGS. 3A-3B for ease of illustration, any number of fins may be formed, such as one, two, three, five, ten, hundreds, thousands, millions, and so forth, as can be understood based on this disclosure.

In some embodiments, the germanium fin 207 may be included in the channel region 255 of one or more transistor. In some such embodiments, each germanium fin 207 may make up all or part of a given device's channel region 255. In other embodiments, a subsequently formed NMOS channel layer 220 material on germanium fin 207 makes up the rest of the channel region 255. In still other embodiments, for example, the germanium fin 207 may be completely below the channel region 255 of a given transistor 295 where it is completely contained in a sub-channel or sub-fin region. In yet other embodiments, the germanium fin 207 can be used as a template or a seeding layer from which to form various different channel layers 220, as will be described in more detail below.

Further, in some such embodiments, the germanium fin 207 may be doped. For instance, in some embodiments, the germanium of the germanium fin 207 may be lightly n-type doped (e.g., with a doping concentration in the range of 1E15 to 1E18 atoms per cubic cm). Example n-type dopants include, for instance, silicon and magnesium, although other suitable dopants can be used as well. In other embodiments, the fins are undoped (or nominally undoped, with a dopant concentration less than 1E16 atoms per cubic cm).

Figure 4A:
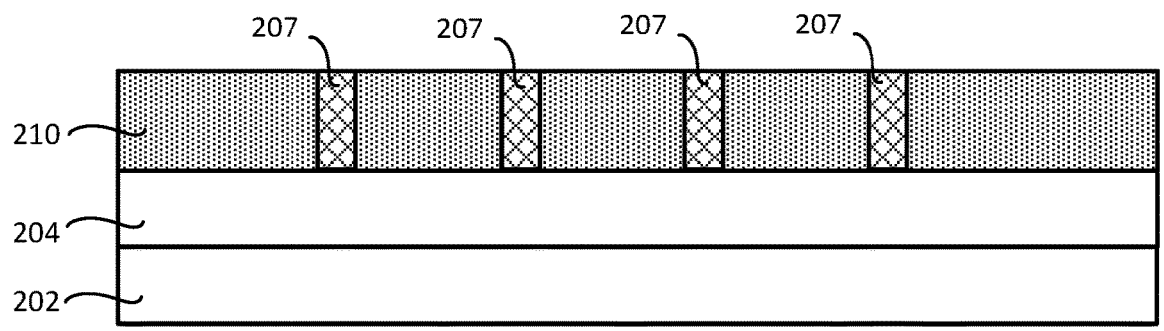
FIGS. 4A and 4B illustrate cross-sectional and perspective views, respectively, of an example structure after depositing an insulator layer between the germanium fins and planarizing, in accordance with some embodiments of the present disclosure.
Figure 4B:
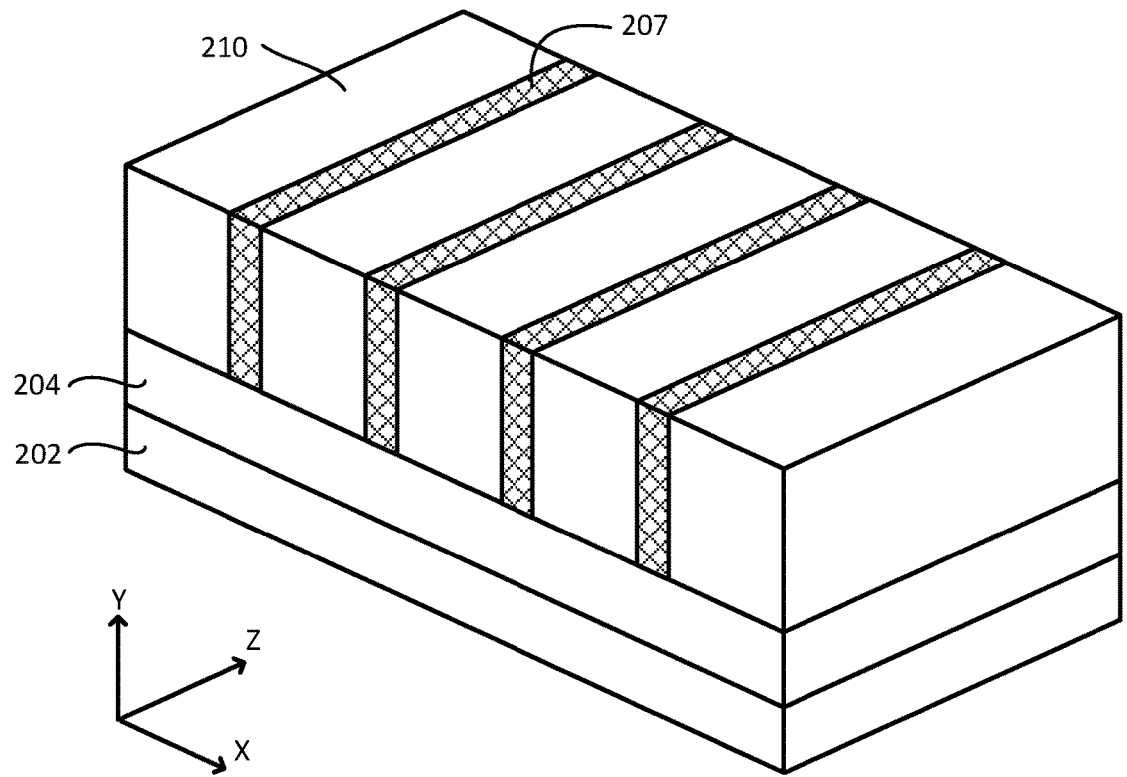

Referring now to FIGS. 4A-4B, cross-sectional and perspective views, respectively, illustrate an example structure in accordance with some embodiments of method 100. To arrive at the example structure shown in FIGS. 4A-4B, for example, method 100 of FIG. 1 continues with forming 104 a sacrificial layer 210 over the germanium fins 207 and insulator layer 204, followed by planarization. As can be seen, sacrificial layer 210 fills the space between germanium fins 207 and is co-planar with an exposed top surface of germanium fins 207. The sacrificial layer 210 may be formed using any suitable techniques, such as one or more of chemical vapor deposition (CVD), metalorganic CVD (MOCVD), physical vapor deposition (PVD), atomic layer deposition (ALD), molecular beam epitaxy (MBE), and/or any other suitable process as can be understood based on this disclosure. In some embodiments, sacrificial layer 210 may include a multilayer structure including two or more distinct layers. In some embodiments, sacrificial layer 210 may include grading (e.g., increasing and/or decreasing) of one or more material concentrations throughout at least a portion of that layer. Such features of layer 210 can be helpful with respect to achieving a desired etch selectivity relative to the germanium fins 207.

Sacrificial layer 210, in some embodiments, may include any suitable insulator material, such as one or more oxides (e.g., silicon dioxide), nitrides (e.g., silicon nitride), dielectrics, or other electrically insulating materials. In some embodiments, the material of sacrificial layer 210 may be selected based at least in part on the sacrificial material 210 being able to be selectively removed relative to the germanium fins 207 or fins of replacement semiconductor material as will also be described in more detail below. In a more general sense, layer 210 can be any material that provides a desired degree of etch selectivity with respect to the fins.

Figure 5A:
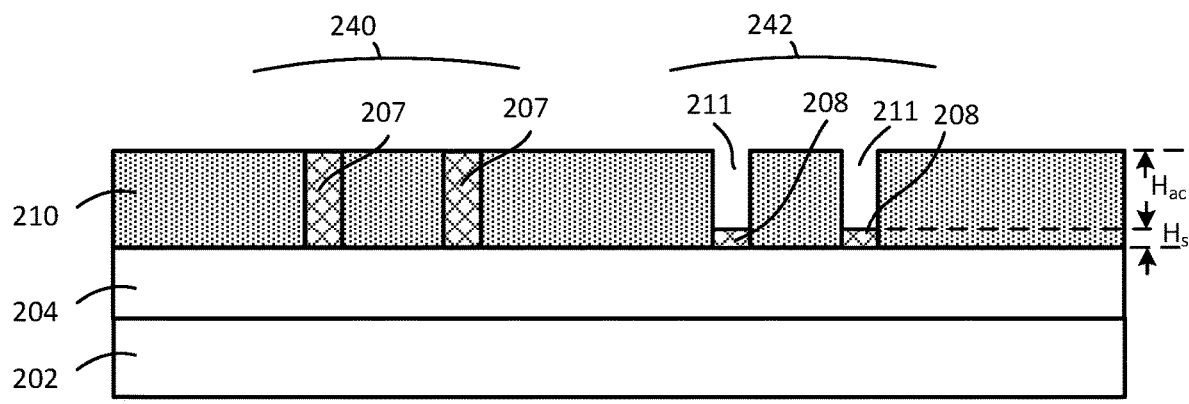
FIGS. 5A and 5B illustrate cross-sectional and perspective views, respectively, of an example structure after recessing some of the germanium fins into the insulator layer, in accordance with some embodiments of the present disclosure.
Figure 5B:
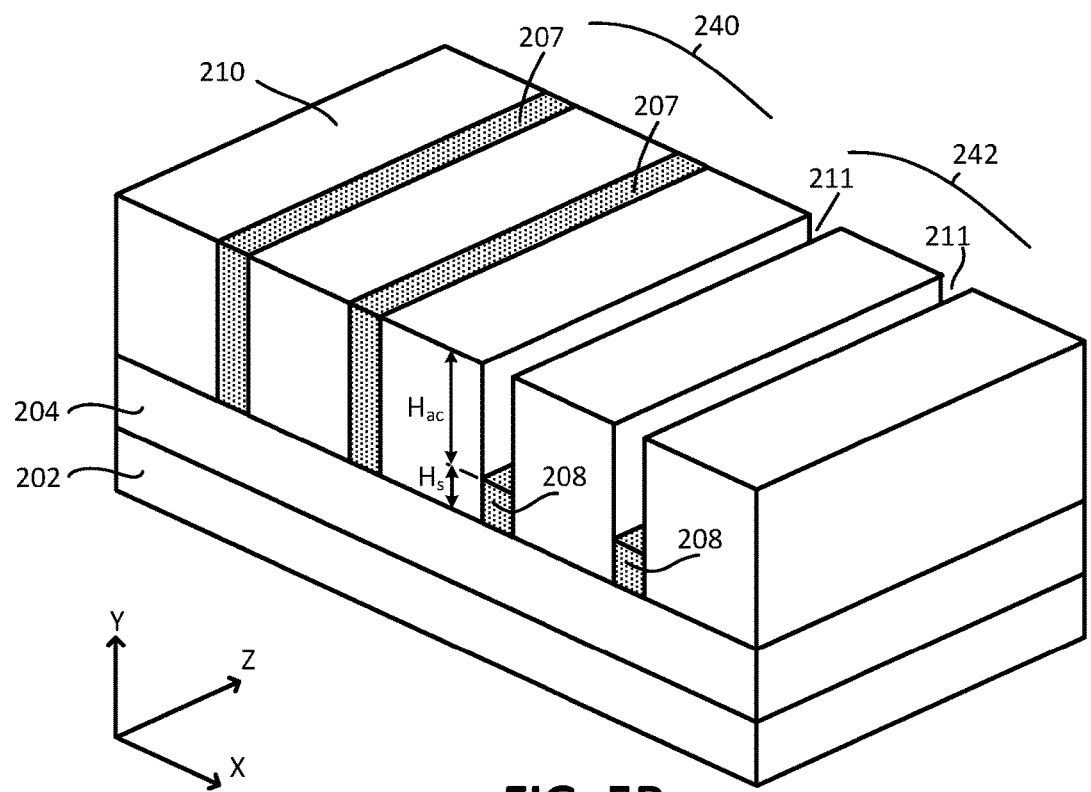

The method 100 continues with recessing 108 germanium fins 207 in an NMOS region 242 to provide trenches 211 and corresponding germanium seed layers 208 or fin stubs 208 with a reduced height $H_S$ as shown, for example, in FIGS. 5A-5B. Note that germanium fins 207 in a PMOS region 240 can be masked off or otherwise protected from the fin recess process and are therefore not recessed, in accordance with some embodiments. In one embodiment, some germanium fins 207 (e.g., germanium fins 207 of an NMOS region 242) are recessed 108 to a height $H_S$ that effectively defines the active channel fin height $H_{ac}$ based on the trench height defined by the surrounding sacrificial material 210. Recessing 108 the germanium fins 207 may be performed using any suitable process, such as using a wet chemical etchant suitable for etching germanium but selective to layer 210. In some embodiments, for example, the germanium fins 207 of the NMOS region 242 are recessed 108 to provide an active channel fin height $H_{ac}$ in the range of 10 nm to 300 nm. In a more general sense, the depth of the trenches 211 (which effectively defines the active channel fin height $H_{ac}$) can be set to any suitable depth, as will be appreciated.

Figure 6A:
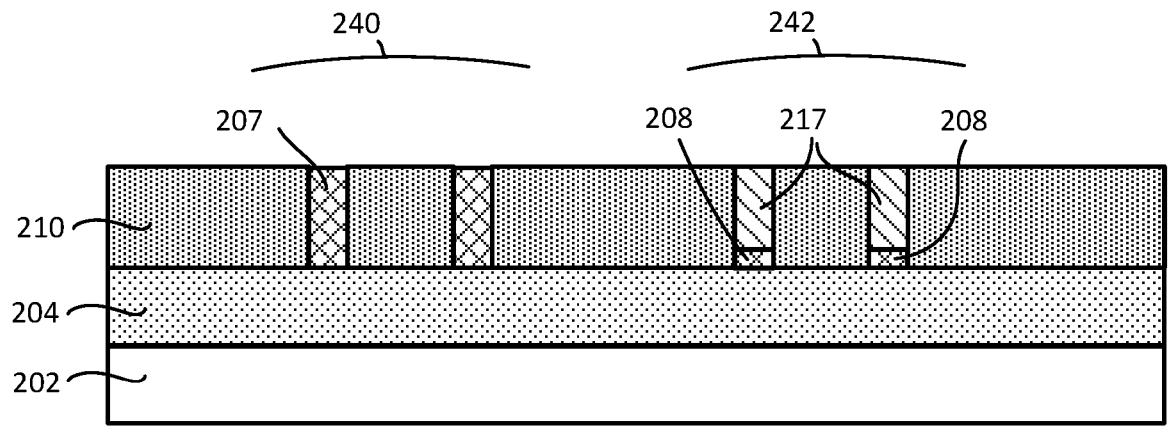
FIGS. 6A and 6B illustrate cross-sectional and perspective views, respectively, of an example structure after forming a III-V layer on germanium seed layers, in accordance with some embodiments of the present disclosure.
Figure 6B:
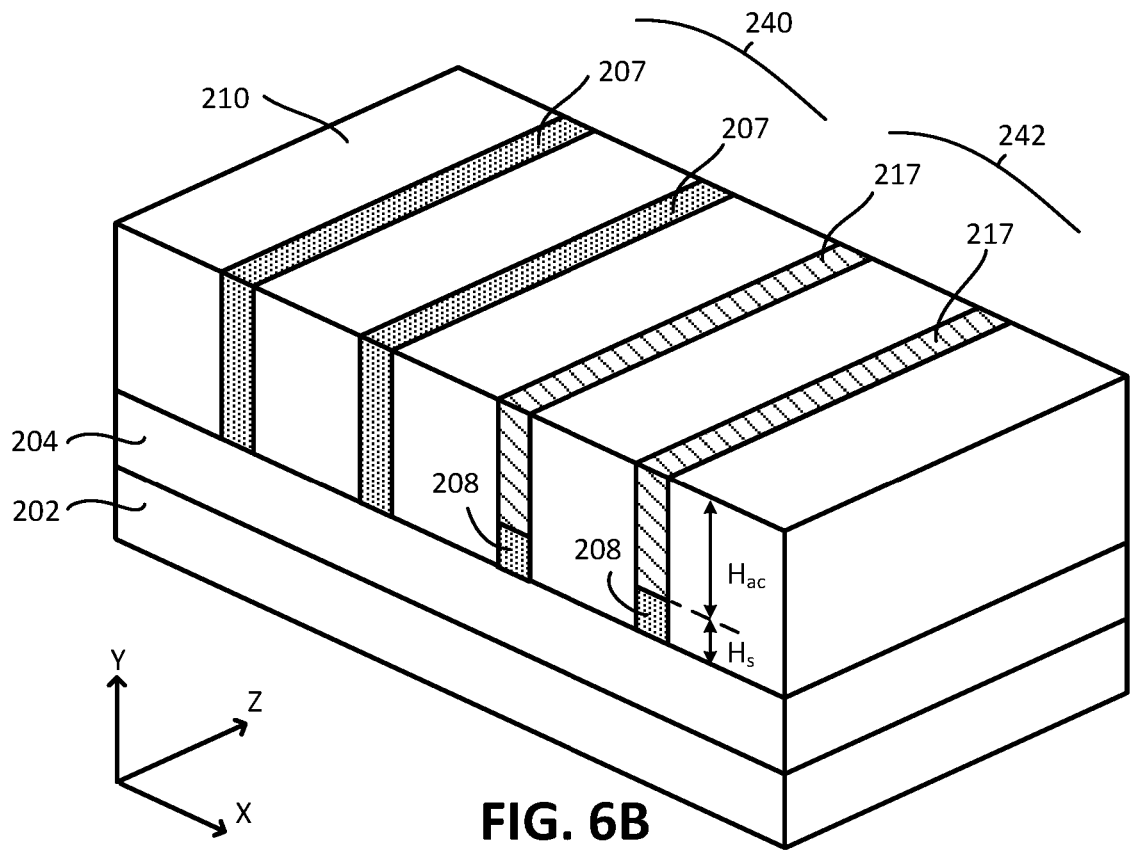

Referring now to the cross-sectional and perspective views of FIGS. 6A-6B, method 100 of FIG. 1 continues with epitaxially depositing 110 group III-V material into trenches 211 and on top of the germanium seed layers 208 to form a set of group III-V material fins 217, followed by planarization down to the tops of the fins, in accordance with some embodiments. The III-V material fins 217 can be formed 114 using any suitable processes, such as CVD, PVD, ALD, VPE, MBE, LPE and/or any other suitable processing. As previously explained, the lattice mismatch between the underlying germanium seed layer 207 and the group III-V fin 217 material is such that are no or otherwise relatively fewer defects than if the group III-V fin 217 material was grown from a silicon base.

The group III-V fins 217 may include any number of group III-V semiconductor materials, such as GaAs, InGaAs (e.g., $In_{0.53}Ga_{0.47}As$), InP, AlGaAs, or AlAs, to name a few examples. For example, in some embodiments, group III-V fin 217 material is a single-crystal semiconductor selected to be lattice matched or have a lattice mismatch of 4% or less with respect to the germanium seed layer 208. In other embodiments, the group III-V fin 217 material has a lattice mismatch of at most 2%, at most 3%, at most 5%, at most 6%, at most 7%, at most 8%, at most 9% or at most 10% with respect to the germanium seed layer 208. Note that in some embodiments, the group III-V fin 217 material can be selected for its impact on transistor performance. For instance, in some embodiments, the group III-V fin 217 material has a carrier mobility of at least 400 $cm^2/Vs$, at least 500 $cm^2/Vs$, at least 600 $cm^2/Vs$ at least 700 $cm^2/Vs$, at least 750 $cm^2/Vs$, at least 800 $cm^2/Vs$, at least 850 $cm^2/Vs$, at least 900 $cm^2/Vs$, or at least 1000 $cm^2/Vs$.

In some embodiments, the group III-V fin 217 material may be lightly doped at a dopant concentration in the range of, for example, 1E16 to 1E18 atoms per cubic cm, for example. In some embodiments, the group III-V fin material may be p-type doped, for instance, with boron or gallium. In other embodiments, the III-V material layer 217 material may be intrinsic/undoped (or nominally undoped, with a dopant concentration less than 1E16 atoms per cubic cm), depending on the particular configuration.

In some embodiments, the group III-V fins 217 may include a multilayer structure that includes two or more distinct layers (that may or may not be compositionally different). In some such embodiments, the group III-V fins 217 may be formed using a layer-by-layer epitaxial growth approach (e.g., using an MBE process), such that the group III-V fins 217 may or may not appear to have distinct interfaces, depending on the particular configuration and observation level. In embodiments where a nanowire (or nanoribbon or GAA) transistor is to be formed from the group III-V fin 217 material, the structure of fins 217 may include at least one group III-V material and at least one sacrificial layer to be removed (e.g., after the dummy gate material is removed, other otherwise during final gate processing) to release the group III-V material layer 217 in the channel region to enable forming that nanowire transistor, as will be described in more detail below with reference to FIG. 10. For instance, in an example embodiment, a given group III-V fin 217 structure may include alternating layers of group IV and group III-V semiconductor materials, where the group IV material is sacrificial to enable the formation of one or more group III-V material nanowires in the channel region and where the sacrificial group IV material is subsequently removed using an etch scheme selective to the group III-V material (meaning that the III-V material etches substantially slower than the group IV material, for that given etch scheme), such as during replacement gate processing. In other such embodiments, the group III-V fin 217 structure may include alternating layers of insulator (or otherwise inactive) material and group III-V semiconductor material, where the insulator material is sacrificial to enable the formation of one or more group III-V material nanowires in the channel region and where the sacrificial material is subsequently removed using an etch scheme selective to the group III-V material (meaning that the III-V material etches substantially slower than the insulator material, for that given etch scheme).

In some embodiments, the group III-V fin 217 structure may include grading (e.g., increasing and/or decreasing) the concentration of one or more materials within the feature, such as the grading of a semiconductor material component concentration and/or the grading of the dopant concentration, for example. For instance, the grading may occur as the material of fin 217 structure is epitaxially grown (e.g., in the Y-axis direction).

In some embodiments, multiple different group III-V fins 217 may be formed on different areas of the substrate 200. For instance, a first set of group III-V fins 217 may be formed on a first area of the substrate 200 to be used for one or more NMOS devices that perform a first function (e.g., IO transistors), and a second set of group III-V fins 217 may be formed on a second area of the substrate 200 to be used for one or more NMOS devices) that perform a second function (e.g., power transistors). By selecting the germanium seed layer 208 to have the desired crystal quality, multiple types of group III-V fins 217 can be grown.

Figure 7A:
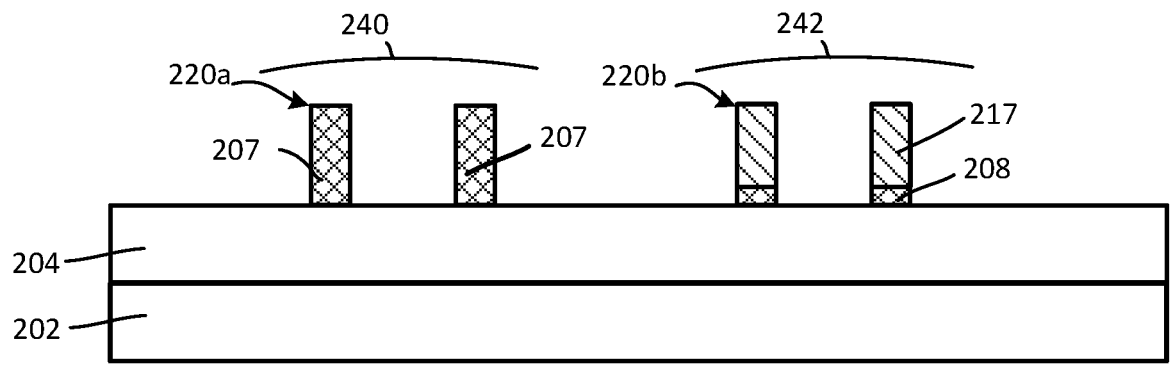
FIGS. 7A and 7B illustrate cross-sectional and perspective views, respectively, of an example structure after removing or otherwise recessing the insulator layer to expose the germanium fins and III-V fins, in accordance with some embodiments of the present disclosure.
Figure 7B:
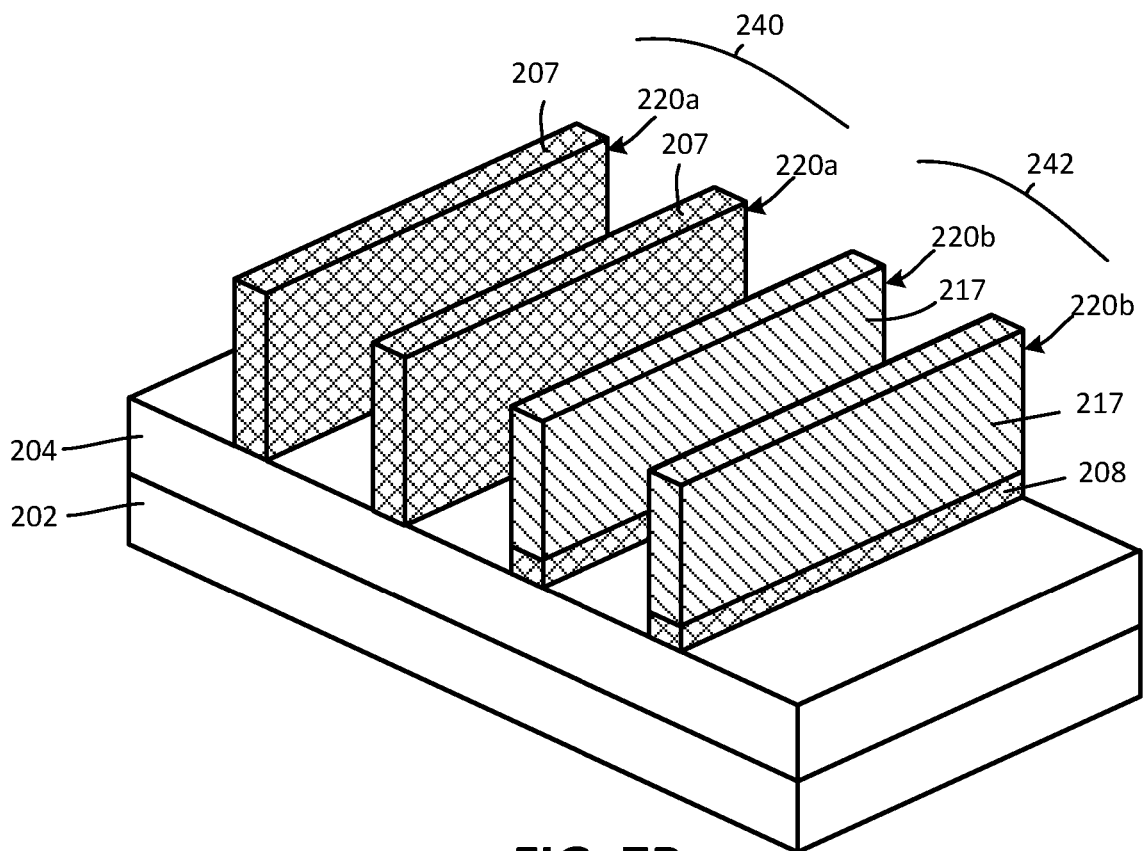

With further reference to FIG. 1, the method 100 continues with removing 112 the sacrificial material layer 210, to reveal a first set of fins suitable for PMOS devices and a second set of fins suitable for NMOS devices. Referring now to FIGS. 7A-7B, cross-sectional and perspective views, respectively, show p-channel layers 220a and n-channel layers 220b exposed after removing sacrificial layer 210 in accordance with an embodiment of the present disclosure. In this example embodiment, p-channel layers 220a comprise germanium fins 207 in a PMOS region 240 and n-channel layers 220b comprise group III-V fins 217 formed on germanium fin stubs (or seed layer) 208 in an NMOS region 242.

Referring now to FIGS. 8-11, method 100 of FIG. 1 continues with completing 120 formation of one or more transistor devices. Completing 120 the transistors starts from the example structure of FIGS. 7A-7B, where germanium fins 207 define a p-channel layer 220a in a PMOS region 240 and group III-V fins 217 atop a germanium seed layer 208 define an n-channel layer 220b in an NMOS region 242, in accordance with an embodiment of the present disclosure. The n-channel layer 220b and p-channel layer 220a may be referred to individually or collectively as channel layer(s) 220. As will be further appreciated, the term "channel layer" is used here to simply acknowledge that transistor channel regions can be formed using the various fins provided, and is not intended to be limiting in any other way.

Completing 120 the transistor includes forming 122 a dummy gate structure 261, or final gate structure 261 as the case may be, in accordance with some embodiments. The processing is primarily described herein in the context of a gate-last transistor fabrication flow, where the processing includes forming a dummy gate structure 261, performing the source/drain ("S/D") processing, and then forming the final gate structure 261 after the S/D regions have been processed. In other embodiments, the techniques may be performed using a gate-first process flow. In such example embodiments, a dummy gate stack need not be formed, as the final gate stack can be formed in the first instance. However, the description of the continued processing will be described using a gate-last process flow, to allow for such a gate-last flow (which may include additional processing) to be adequately described. Regardless, the end structure of either a gate-first or a gate-last process flow will include a final gate structure 261, as will be apparent in light of this disclosure.

Figure 8:
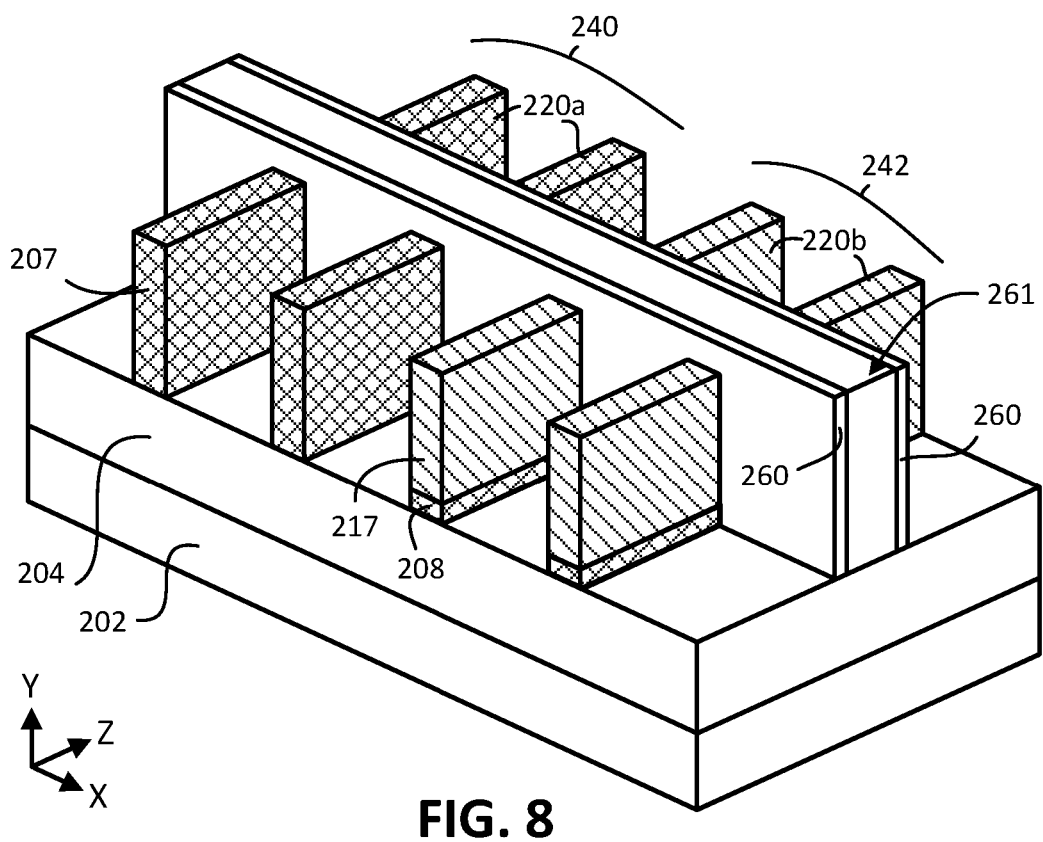
FIG. 8 illustrates a perspective view of the example structure of FIG. 7B after forming a gate structure over the fin-shaped channel materials, in accordance with some embodiments of the present disclosure.

Referring to FIG. 8, a perspective illustration shows an example structure after forming a dummy gate structure 261 on channel layers 220. Dummy gate stack 216 includes dummy gate dielectric 262 (e.g., oxide material) and dummy gate electrode 264 (e.g., poly-silicon material). Note that gate spacers 260 on either side of the dummy gate structure 261 are also formed, in this example embodiment. Gate spacers 260 can help determine the channel length and/or help with replacement gate processing, for example.

Formation of the dummy gate structure 261 to arrive the structure shown in FIG. 8, for example, may include depositing the dummy gate dielectric 262 material and dummy gate electrode 264 material, patterning the dummy gate structure 261, depositing gate spacer 260 material, and performing a gate spacer etch. Gate spacers 260 may include any suitable material, such as any suitable electrical insulator, dielectric, oxide (e.g., silicon oxide), and/or nitride (e.g., silicon nitride) material. Note that in some embodiments, a hardmask (not shown) may be formed over the dummy gate structure 261 (which may or may not also be formed over spacers 260) to protect the dummy gate structure 261 during subsequent processing, for example.

As will be appreciated, the dummy gate structure 261 (and spacers 260) effectively defines the channel region of each channel layer 220, where the channel region is generally below the dummy or final gate structure 261, and the S/D regions 270 are on either side of and adjacent the channel region, such that the gate structure 261 is between the S/D regions 270.

Figure 9:
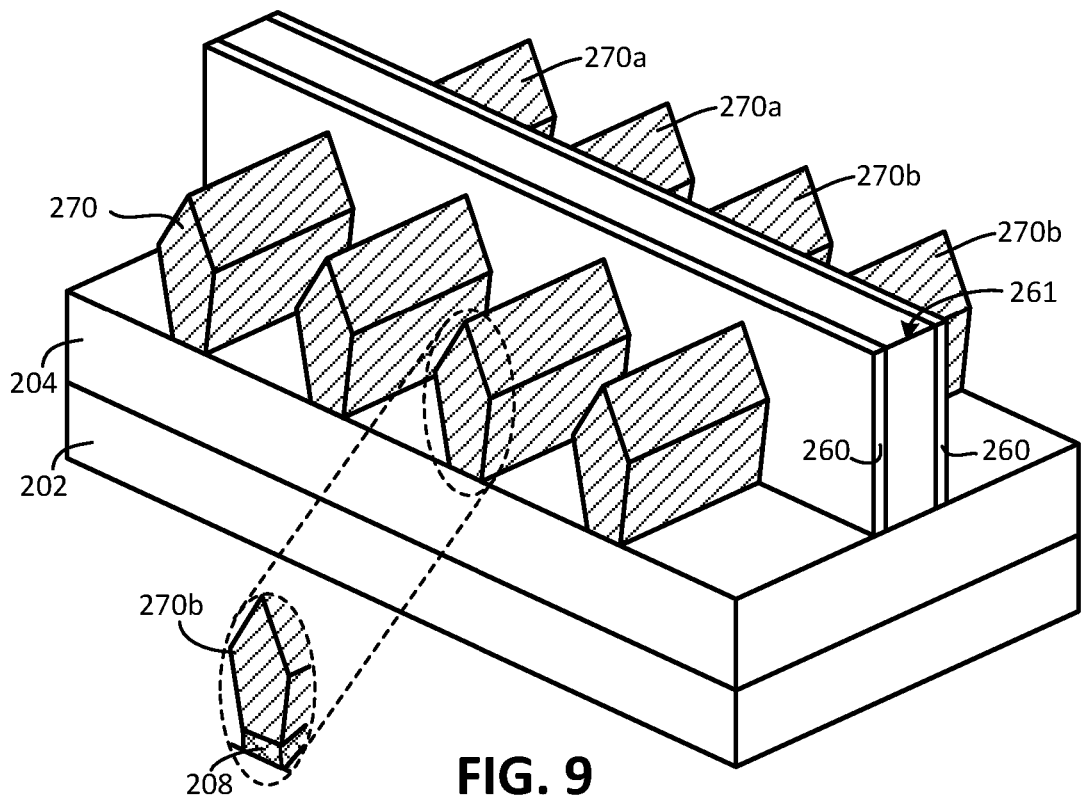
FIG. 9 illustrates a perspective view of the example structure of FIG. 8 after processing source and drain regions of each fin, in accordance with some embodiments of the present disclosure.

Referring now to FIG. 9, method 100 of FIG. 1 continues with processing 124 source and drain (S/D) regions 270 to form the example resulting structure as shown, in accordance with some embodiments. The S/D regions 270a, 270b correspond n-channel layers 220a and p-channel layers 220b, respectively, and may be referred to collectively as S/D regions 270. The S/D regions 270 may be formed using any suitable techniques, such as masking regions outside of the S/D regions 270 to be processed, etching at least a portion of the exposed fins of channel layer 220, and epitaxially growing or otherwise depositing the S/D regions 270 (e.g., using any suitable deposition techniques, such as CVD, PVD, ALD, VPE, MBE, LPE), for example. However, in other embodiments, the S/D regions 270 are formed by implantation doping the fins 207 or 217, wherein the material of S/D regions 270 is native to the fins 207 and 217.

FIG. 9 further illustrates an alternate embodiment of a S/D region 270b where at least a portion of the underlying germanium seed layer 208 still remains in the S/D region 270, in accordance with some embodiments. As shown, the final S/D material 270b was formed on the germanium fin stub or seed layer 208. In such cases, note that the germanium seed layer 208 can act as an etch stop during the S/D etch and replace process at 124.

In some embodiments, one or more of the S/D regions 270 may have a multilayer structure including two or more distinct layers, for example. For instance, in some configurations, the S/D regions 270a have a bi-layer structure that includes a SiGe carbide liner and a germanium-rich cap layer thereon, such that the SiGe carbide liner is between the channel region 255 and the Ge-rich cap layer. Numerous such multilayer S/D configurations can be used. In some embodiments, one or more of the S/D regions 270 may include grading (e.g., increasing and/or decreasing) the content/concentration of one or more materials in some or all of the region(s). For instance, in some embodiments, it may be desired to gradually increase the concentration of a given dopant as a given S/D region 270 is formed, to have a relatively lower doping concentration near the channel region and a relatively higher doping concentration near the corresponding S/D contact 270 (to improve contact resistance).

In some embodiments, the S/D regions 270 may be formed one polarity at a time, such as performing processing for one of n-type and p-type S/D regions 270, and then performing processing for the other of the n-type and p-type S/D regions 270. In some embodiments, the S/D regions 270 may include any suitable material, such as monocrystalline group IV and/or group III-V semiconductor material and/or any other suitable semiconductor material. In some embodiments, the S/D regions 270 may include the same group of semiconductor material as what is included in the corresponding channel layer 220, such that if the given channel layer 220 includes group III-V semiconductor material, the corresponding S/D regions 270 may also include group III-V semiconductor material (whether the same III-V material or different); however, the present disclosure is not intended to be so limited. In some embodiments, the S/D regions 270 may include any suitable doping scheme, such as including suitable n-type and/or p-type dopant (e.g., in a concentration in the range of 1E18 to 2E22 atoms per cubic cm). In some specific example embodiments, S/D regions 270a include silicon, germanium, SiGe, SiGe carbide, to name a few examples, while S/D regions 270b include InGaAs, InAlAs, indium arsenide phosphide (InAsP), indium gallium arsenide phosphide (InGaAsP), gallium antimonide (GaSb), gallium aluminum antimonide (GaAlSb), indium gallium antimonide (InGaSb), or indium gallium phosphide antimonide (InGaPSb), to name a few examples). P-type dopants for S/D regions 270a include, for example, boron and gallium, while n-type dopants for S/D regions 270b include, for example, silicon and magnesium.

In some embodiments, the S/D regions 270 may include differing materials, dopant schemes, shapes, sizes, corresponding channel regions (e.g., 1, 2, 3, or more), and/or any other suitable difference as will be appreciated. For instance, the S/D regions 270 of FIG. 9 are shown as being faceted. A domed shape or rectangular shape may also be provisioned, to provide a few examples. Further note that the shading or patterning of the features/layers of the IC structures included in the Figures (such as S/D regions 270) is provided merely to assist in visually distinguishing those different IC features/layers. Such shading or patterning is not intended to limit the present disclosure in any manner and shading variations between similar figures may occur. Numerous transistor S/D configurations and variations will be apparent in light of this disclosure.

Figure 10:
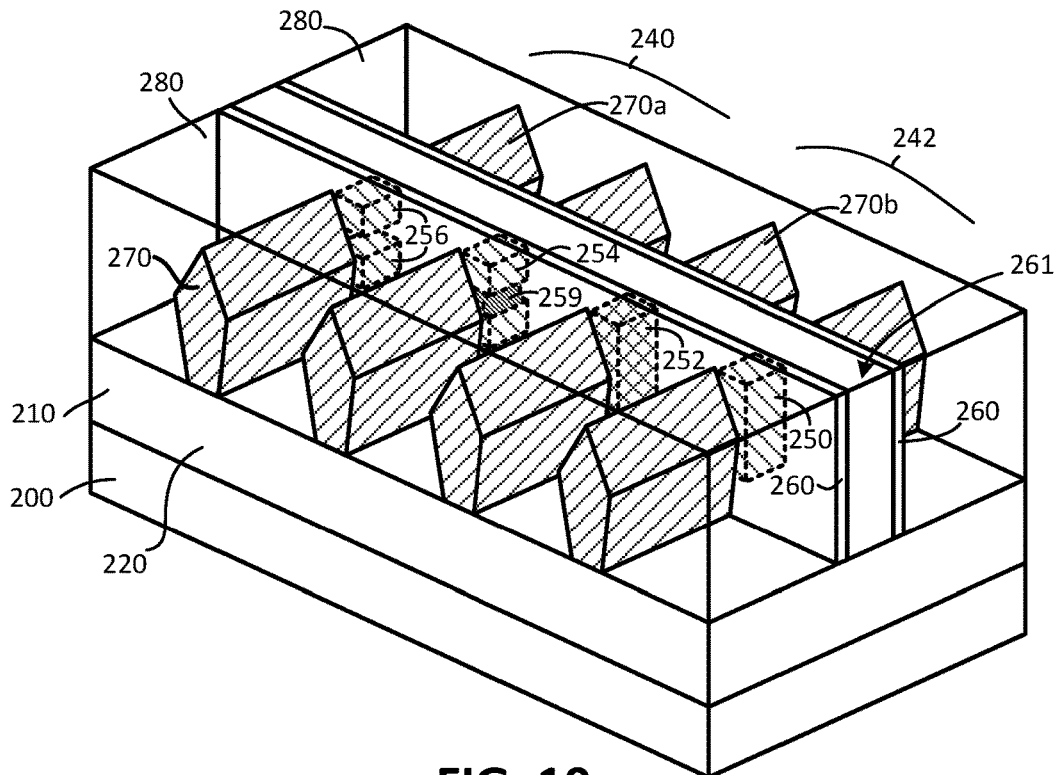
FIG. 10 illustrates a perspective view of the example structure after processing a nanowire channel region, a beaded fin region, and a finned channel region, in accordance with some embodiments of the present disclosure.

Referring now to FIG. 10 and with continued reference to FIG. 1, method 100 continues with processing 126 the final gate structure 261 to form the example resulting structure as shown, in accordance with some embodiments. In this example embodiment, processing includes depositing an insulator fill material (isolation region) 280 on the structure of FIG. 9, followed by planarization and/or polishing (e.g., by CMP) to reveal the top of dummy gate structure 261. Note that the isolation region 280 may include a multilayer structure, even though it is illustrated as a single layer. Further note that in some cases, isolation region 280 and insulating layer 204 may not include a distinct interface as illustrated in FIG. 10, particularly where, e.g., the isolation region 280 and insulating layer 204 include the same dielectric material. The isolation region 280 may include any suitable insulator material, such as one or more oxides (e.g., silicon dioxide), nitrides (e.g., silicon nitride), dielectrics, and/or an electrically insulating material, for example.

The gate stack processing in this example embodiment includes removing the dummy gate structure 261 (including dummy gate electrode 264 and dummy gate dielectric 262) to allow for the final gate structure 261 to be formed. Recall that in some embodiments, the formation of the final gate structure 261, which includes gate dielectric 282 and gate electrode 284 (as better shown in FIGS. 12A-14B), may be performed using a gate-first fabrication flow (e.g., an up-front high-k gate process). In such embodiments, the final gate processing 122 may have been performed prior to the S/D processing 124, for example. Further, in such embodiments, process 126 need not be performed, as the final gate structure 261 would have already been formed in process 122. However, in this example embodiment, the gate structure 261 is formed using a gate-last fabrication flow, which may also be considered a replacement gate or replacement metal gate (RMG) process. Regardless of whether gate-first or gate-last processing is employed, the final gate structure 261 can include gate dielectric 282 and gate electrode 284 (as better shown in FIGS. 12A-14B, which will be described in turn), in accordance with some embodiments.

Note that when the dummy gate materials are removed, the channel regions of the underlying fins that were covered by the dummy gate are exposed to allow for any desired processing of those channel regions. Such processing of the channel regions may include various different techniques, such as fin shaping or sculpting, doping the channel region as desired, forming the channel region of the fin into one or more nanowires (or nanoribbons) for a gate-all-around (GAA) transistor configuration, forming the channel region of the fin into a beaded-fin configuration, cleaning/polishing the channel region, and/or any other suitable processing as will be apparent in light of this disclosure.

In addition to finned configurations utilizing a tri-gate or double-gate structure, other non-planar transistor configurations are also shown in the example structure of FIG. 10. For example, a p-channel 220a of PMOS region 240 includes two nanowires 256 (or nanoribbons) in this example case. For instance, nanowires 256 may be formed after removing the dummy gate structure 261 to expose p-channel layer 220a, such as by converting the finned p-channel layer 220a at that location into germanium nanowires 256 by removing intervening material between those nanowires. For example, the original germanium fin 207 of p-channel layer 220a may have included a multilayer structure with one or more sacrificial layers. In such case, a selective etch can be performed to remove the sacrificial layer(s) and define the nanowires 256. In some embodiments, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration.

To provide yet another example non-planar transistor configuration, PMOS region 240 also includes a beaded-fin 254 p-channel region 220a that is a hybrid between a finned channel region and a nanowire channel region, where a sacrificial material 259 was partially removed to define the resulting hour-glass or so-called beaded-fin 254 structure shown. In contrast, sacrificial material 259 can be completely removed to define nanowires. Such a beaded-fin 254 structure may benefit, for example, from increased gate control (e.g., compared to a finned channel region structure) while also having relatively reduced parasitic capacitance (e.g., compared to a nanowire 256 structure). Therefore, numerous different channel region configurations can be employed using the techniques described herein, including planar and various non-planar configurations.

Continuing with the example structure of FIG. 10, after the dummy gate has been removed and any desired channel region processing has been performed, the final gate structure 261 can be formed, in accordance with some embodiments. In this example embodiment, the final gate structure 261 includes a gate dielectric structure and a gate electrode structure. The gate dielectric structure may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric structure to improve its quality when high-k dielectric material is used. The gate electrode structure may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric structure and/or gate electrode structure may include a multilayer structure of two or more material layers, for example. For instance, in some embodiments, a bilayer gate dielectric structure may be employed, wherein the structure includes a first layer of oxide native to the underlying fin, and a second layer of hafnium oxide on the native oxide. In such cases, note that it may be difficult to distinguish the native oxide portion of the gate dielectric structure from the underlying insulator layer 204 (particularly if those two features are the same material), but in any case they are different layers (e.g., layer 204 being formed by deposition and the native oxide portion of the gate dielectric being formed by an oxidation process). Likewise, the gate electrode may include multiple layers, such as one or more relatively high or low work function layers disposed about a metal core or plug (e.g., titanium nitride about a tungsten plug). Example work function materials for PMOS devices include, for instance, titanium nitride, tantalum nitride, ruthenium, palladium, platinum, cobalt, nickel, and conductive metal oxides (e.g., ruthenium oxide). Example work function materials for NMOS devices include, for instance, hafnium, zirconium, titanium, tantalum, aluminum, alloys of these metals, and carbides of these metals such as hafnium carbide, zirconium carbide, titanium carbide, tantalum carbide, and aluminum carbide. Numerous different gate structure 261 configurations will be apparent in light of this disclosure.

Figure 11:
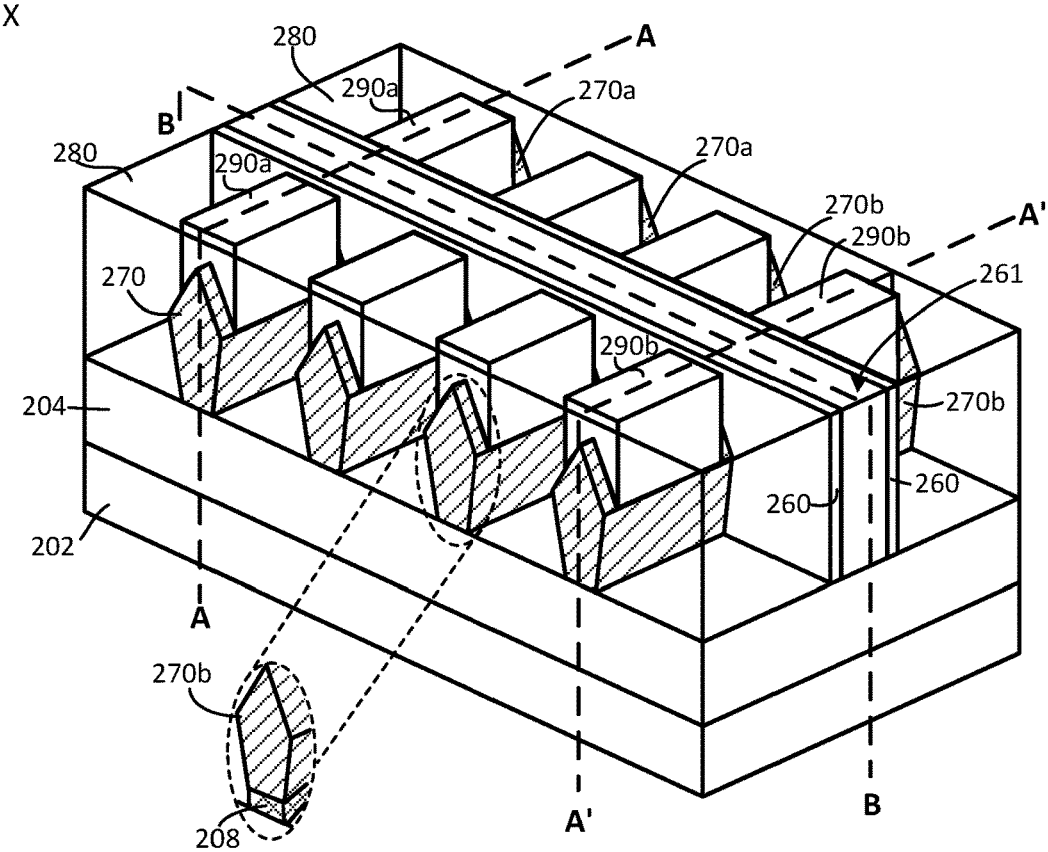
FIG. 11 illustrates the example structure of FIG. 10 after processing source/drain contacts, in accordance with some such embodiments of the present disclosure.

Referring now to FIG. 11 with continued reference to FIG. 1, method 100 continues with forming 128 S/D contacts 290 to form the example resulting structure shown, in accordance with some embodiments. S/D contacts 290 are formed in contact with each of the S/D regions 270, in this example embodiment. The S/D contacts 290 may be formed using any suitable techniques, such as forming contact trenches in isolation region 280 over the respective S/D regions 270 and depositing metal or metal alloy (or other suitable electrically conductive material) in the trenches. In some embodiments, forming 128 S/D contacts 290 processing may include silicidation, germanidation, III-V-idation, and/or annealing processes, for example. In some embodiments, S/D contacts 290 may include aluminum or tungsten, although any suitable conductive metal or alloy can be used, such as titanium, copper, silver, nickel-platinum, or nickel-aluminum, for example. In some embodiments, one or more of the S/D contacts 290 may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact 290 regions, such as adhesion layers (e.g., titanium nitride) and/or liner or barrier layers (e.g., tantalum nitride), if so desired. In some embodiments, a contact resistance reducing layer may be present between a given S/D region 270 and its corresponding S/D contact 290, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding S/D region, for example.

Method 100 of FIG. 1 continues with completing 130 a general integrated circuit (IC) as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure. Note that the processes in method 100 of FIG. 1 are shown in a particular order for ease of description. However, one or more of the processes may be performed in a different order or may not be performed at all (and thus be optional), in accordance with some embodiments. Further, processes 104 may be alternatively performed using a replacement fin-based approach, in accordance with some embodiments. Numerous variations on method 100 and the techniques described herein will be apparent in light of this disclosure.

Figure 12A:
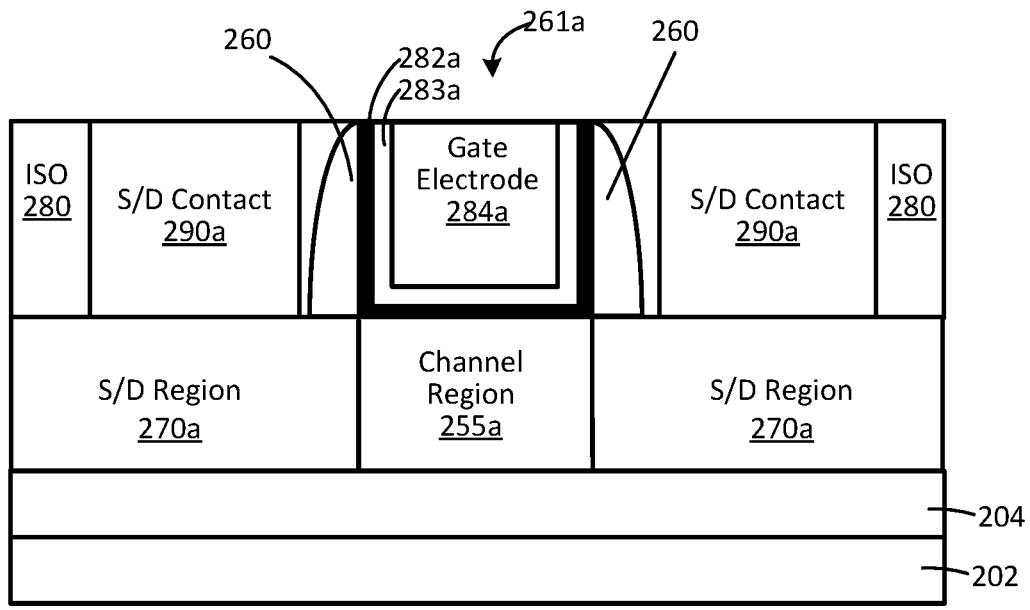
FIGS. 12A and 12B each illustrates a cross-sectional view of an example transistor structure view taken along line A-A of FIG. 11, in accordance with some embodiments of the present disclosure.

Referring now to FIG. 12A an example cross-sectional view taken along plane A-A of FIG. 11 illustrates a transistor structure configured in accordance with some embodiments of the present disclosure. The cross-sectional view through the channel layer 220a and parallel to the fin 207 is provided to show example details of an example PMOS device. Further note that this example transistor structure includes either a planar transistor configuration (where the gate is on top of the channel region 255a) or a fin-based transistor configuration (where the gate is on the top and opposing sidewalls of the channel region 255a). As will be appreciated, the previous relevant description with respect to the each similarly numbered feature is equally applicable here. Note also that variations between the features may be depicted, such as with respect to the shape and/or configuration of gate spacers 260, finned channel region 255a, and/or gate structure 261.

As can be seen, channel region 255a is generally below at least part of the gate structure 261, depending on the given transistor configuration, as previously explained. Note that S/D regions 270a are adjacent to either side of a given channel region 255a, as can be further seen in FIG. 12A. As can be further seen, the gate structure 261 includes gate dielectric 282a, work function material 283a, and a gate electrode 284a. Note that the work function material 283a is called out separately for purpose of discussion, but may be considered part of the gate electrode 284a, as will be appreciated. Gate spacers 260 are on each side of the gate structure, as oftentimes done. Note in this example case that the gate dielectric 282a is u-shaped (as seen in the given cross-section) and is therefore between the gate spacers 260 and the gate electrode 284a. In other embodiments, the gate dielectric 282a may be only on the channel region 255a and not on the gate spacers 260. The previous discussion with respect to example gate structure configurations and materials is equally applicable here (see, for instance, discussion of FIG. 10).

With further reference to the example embodiment of FIG. 12A, note that the S/D regions 270a and the channel region 255a sit on or above the insulator layer 204. As will be appreciated, the insulator layer 204 inhibits sub-channel leakage (and subsequently off-state leakage). In one specific example such embodiment, the channel region 255a is a germanium body (e.g., a fin or wire or ribbon, depending on geometry and whether the gate is all around on just on top and opposing sides), the insulator layer 204 is silicon dioxide, and the substrate 202 is a bulk silicon substrate. In such a configuration, the S/D regions 270a can have any number of configurations as previously explained, but in some embodiments, are p-doped silicon, germanium, SiGe, SiGe carbide, or a multilayer structure including some combination of these materials (e.g., SiGe carbide liner with a SiGe cap). Example p-type dopants include boron and gallium, but any number of suitable dopants or impurities at an appropriate concentration can be used, as will be appreciated. In some such embodiments, one or more components of the S/D regions 270a may be graded, such as one example case where the germanium concentration is graded from a relatively low level to a relatively higher level. The previous discussion with respect to example S/D configurations and materials is equally applicable here (see, for instance, discussion of FIG. 9).

The S/D contact structures 290a are on the S/D regions 270a, and are further provided in contact trenches formed in the isolation region 280. The previous discussion with respect to example S/D contact structures and materials is equally applicable here (see, for instance, discussion of FIG. 11).

Figure 12B:
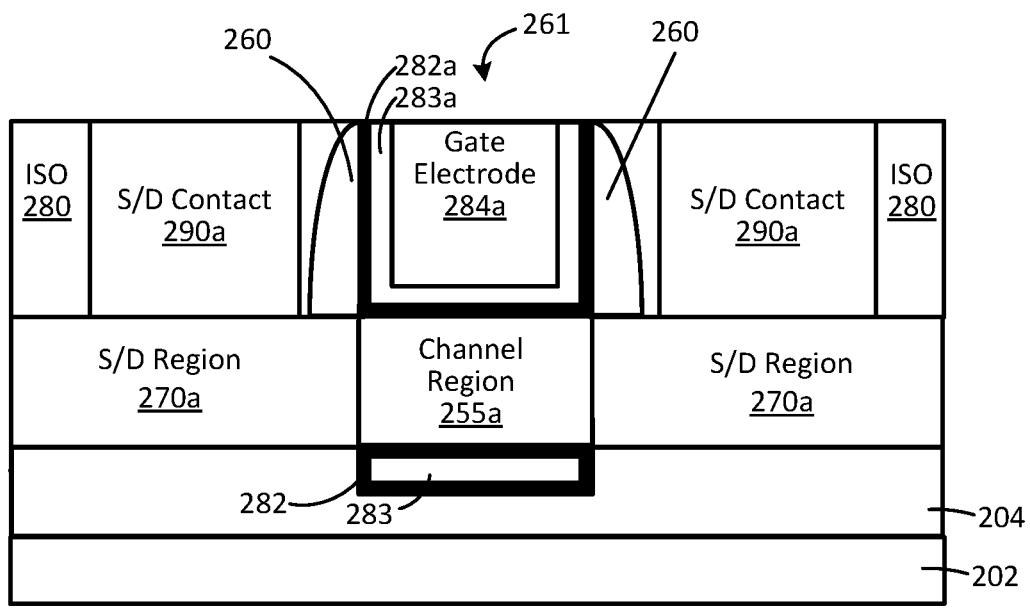

The structure shown in FIG. 12B is similar to the structure shown in FIG. 12A, except that this example transistor structure includes nanowire-based transistor configuration (where the gate is all around the channel region 255a). In such as case, and as previously explained, the channel region can be liberated from the underlying insulator layer 204 during gate processing. For instance, when the dummy gate materials are removed, or the channel region 255a is otherwise exposed prior to providing the final gate materials, an etch selective to the channel material 255a can be used to remove a portion of the insulator layer 204 directly under the channel region 255a (e.g., an isotropic etch). By creating an open space underneath the channel region 255a, the final gate dielectric 282a and gate metal materials (e.g., 283a and possibly 284a) can be deposited all the way around the channel region 255a. As can be seen in the example case of FIG. 12B, the gate dielectric 282a and work function material 283a are all around the channel region 255a. Other gate-all-around configurations will be apparent. As can be further seen in this example embodiment, note that the gate dielectric 283a also deposits on the exposed surfaces of the insulator layer 204. A non-selective ALD process can be used to provide the gate dielectric 282a, according to some embodiments. The work function material 283a can then be selectively deposited on to the gate dielectric 282a to fill any remaining voids below the channel region 255a. Gate electrode 284a material may also be selectively deposited on to the work function material 283a to fill any remaining voids around the channel region 255a. In a more general sense, any number of gate structure forming schemes can be used.

Figure 12C:
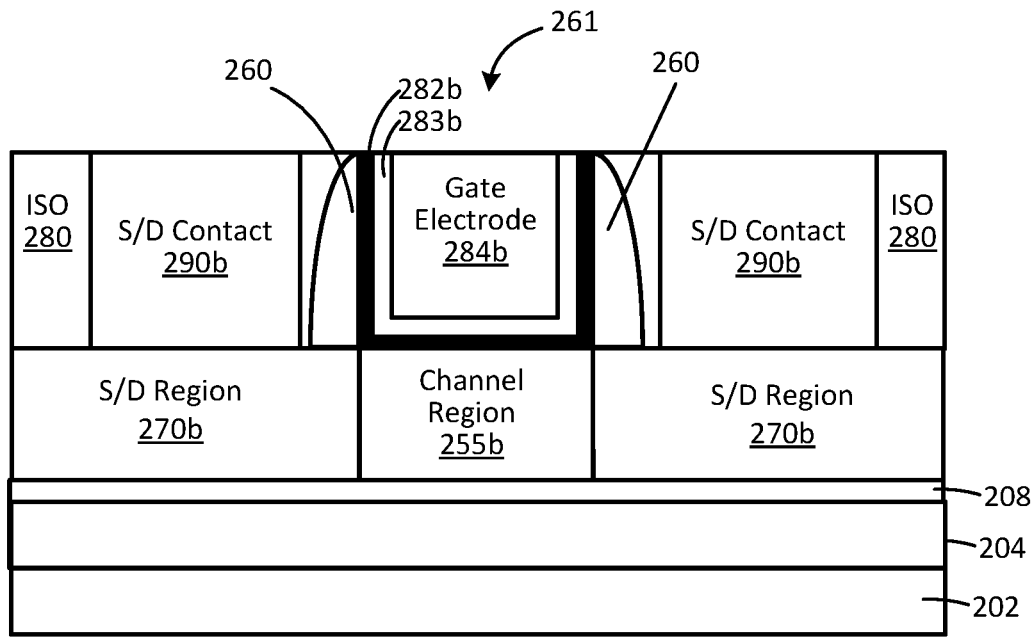
FIGS. 12C and 12D each illustrates a cross-sectional view of an example transistor structure view taken along line A'-A' of FIG. 11, in accordance with some embodiments of the present disclosure.

Referring now to FIG. 12C an example cross-sectional view taken along plane A'-A' of FIG. 11 illustrates a transistor structure configured in accordance with some embodiments of the present disclosure. As can be seen, the cross-sectional view is similar to that of FIG. 12A, except that this cross-section is taken through the channel layer 220b and parallel to the fin 217, to show example details of an example NMOS device. The previous discussion with respect to similar features is equally applicable here, and the remainder of this discussion will focus on what is different. Note that the PMOS and NMOS devices may utilize the same materials and dimensions for certain features, such as the gate dielectrics 282a-b, but in other embodiments may use a first dielectric material for gate dielectric 282a and a second dielectric material for gate dielectric 282b and/or different thicknesses in the respective gate dielectric 282a and 282b locations. Further note that other similarities and differences between the PMOS and NMOS devices will be apparent in light of this disclosure. For instance, while contact structures 290a may be similar in one or more aspects to contact structures 290b, contact structures 290a may include a germanicide while contact structures 290b may include a III-V-icide, given the content of the respective underlying S/D regions 270a and 270b. Likewise, while the core or plug metal of the gate electrode 284 may be the same for both PMOS and NMOS, such as tungsten or aluminum, the work function material 283a for PMOS devices may be different from the work function material 283b for NMOS devices, as previously explained.

With further reference to the example embodiment of FIG. 12C, note that the S/D regions 270b and the channel region 255b sit on or above the relatively thin germanium seed layer 208, which is in turn on or above the insulator layer 204. In one specific example such embodiment, the channel region 255b is a group III-V body (e.g., a fin or wire or ribbon, depending on geometry and whether the gate is all around on just on top and opposing sides), the germanium layer 208 has a germanium concentration in the range of 80 to 100 atomic percent, the insulator layer 204 is silicon dioxide, and the substrate 202 is a bulk silicon substrate. In such a configuration, the S/D regions 270b can have any number of configurations as previously explained, but in some embodiments, are an n-doped III-V material such as those previously noted, or a multilayer structure including some combination of different III-V material layer. Example n-type dopants include silicon and magnesium, but any number of suitable dopants or impurities at an appropriate concentration can be used, as will be appreciated. In some such embodiments, one or more components of the S/D regions 270b may be graded.

The S/D contact structures 290b are on the S/D regions 270b, and are further provided in contact trenches formed in the isolation region 280. The previous discussion with respect to example S/D contact structures and materials is equally applicable here (see, for instance, discussion of FIG. 11).

Figure 12D:
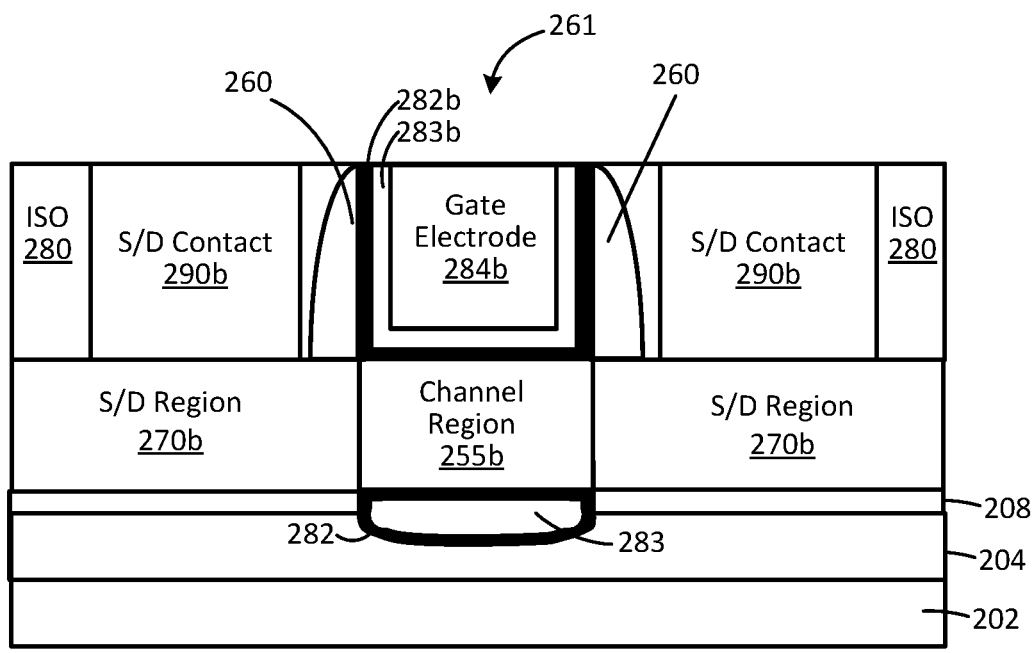

The structure shown in FIG. 12D is similar to the structure shown in FIG. 12C, except that this example transistor structure includes nanowire-based transistor configuration (where the gate is all around the channel region 255b). In such as case, and as previously explained, the channel region 255b can be liberated from the underlying insulator layer 204 during gate processing. For instance, when the dummy gate materials are removed, or the channel region 255b is otherwise exposed prior to providing the final gate materials, an etch selective to the channel material 255b can be used to remove a portion of the insulator layer 204 directly under the channel region 255b (e.g., an isotropic etch). In some cases, the thin germanium seed layer 208 under the group III-V channel region 255b is also completely removed using another selective etch, such as ammonium hydroxide/peroxide solution, which etches germanium relatively faster than III-V materials and other exposed materials. In still other embodiments, only some of the thin germanium seed layer 208 under the group III-V channel region 255b is removed, but not all. As can be further seen, note that the Ge seed layer 208 remains under the III-V material S/D regions 270b, in this example embodiment. In other embodiments, the Ge seed layer 208 may be removed during the etch and replace S/D processing. In still other embodiments, a portion of the Ge seed layer 208 may remain under the III-V material S/D regions 270b, thereby providing a tell-tale sign that the channel region 255b was grown on a Ge seed layer.

As can be seen in the example case of FIG. 12D, the gate dielectric 282b and work function material 283b are all around the channel region 255b. As can be further seen in this example embodiment, note that the gate dielectric 283b also deposits on the exposed surfaces of the insulator layer 204 (via a non-selective ALD process, as previously explained). The work function material 283b can then be selectively deposited on to the gate dielectric 282b to fill any remaining voids below the channel region 255b. Gate electrode 284b material may also be selectively deposited on to the work function material 283b to fill any remaining voids around the channel region 255b. In a more general sense, any number of gate structure forming schemes can be used.

Figure 13:
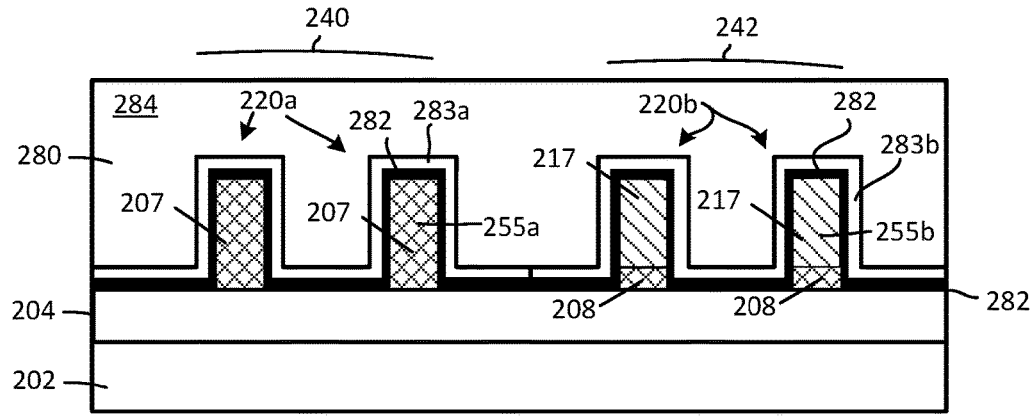
FIG. 13 illustrates a longitudinal section taken along line B-B of FIG. 11, showing an example of a tri-gate gate structure, in accordance with some embodiments of the present disclosure.
Figure 14A:
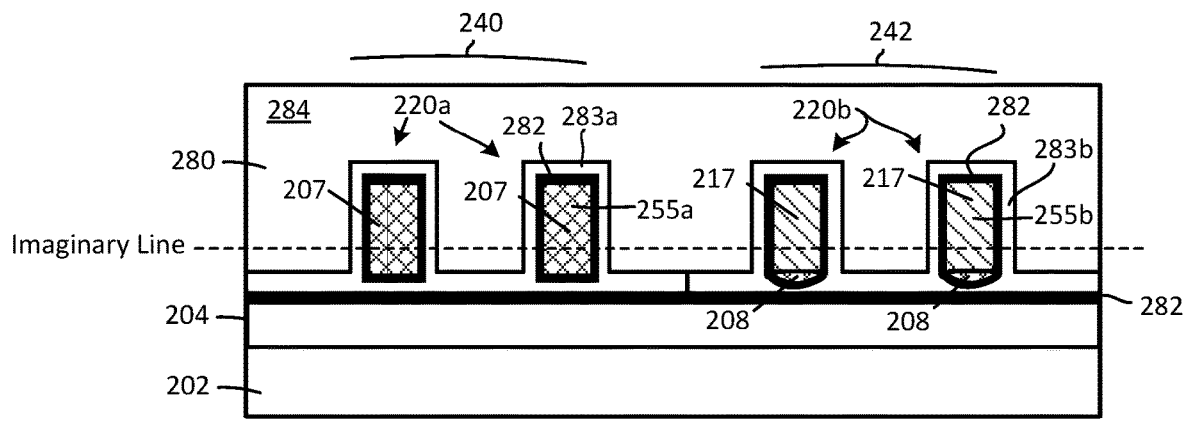
FIGS. 14A and 14B each illustrate a longitudinal section taken along line B-B of FIG. 11, showing an example of a gate-all-around gate structure, in accordance with some embodiments of the present disclosure.
Figure 14B:
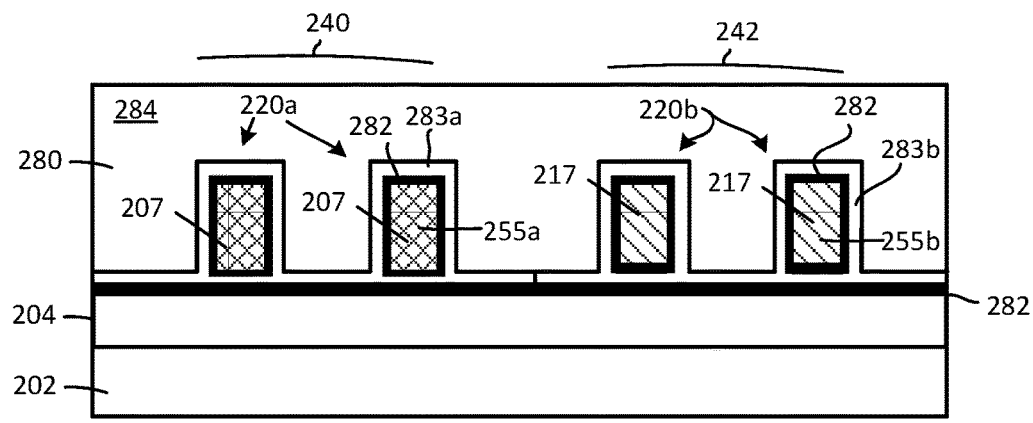

FIGS. 13 and 14A-B each illustrates a cross-section taken along line B-B, which runs perpendicular to the fins and through the gate structure 261 and channel region of the example structure of FIG. 11, and show various configurations of channel regions 255a-b in accordance with some embodiments.

An example of finned channel regions 255a-b is illustrated in FIG. 13, where a common gate dielectric 282 and gate electrode 284 extend along sides and top of the channel regions 255a-b of each respective channel layer 220a-b, but not underneath those channel regions 255a-b. Further in this example embodiment, a PMOS work function material 283a is provided between the gate dielectric 282 and gate electrode 284 of the PMOS device in section 240, and an NMOS work function material 283b is provided between the gate dielectric 282 and gate electrode 284 of the NMOS device in section 242. As can be further seen, germanium fins 207 (which include channel region 255a) extend up from insulator layer 204 of PMOS region 240 to define p-channel layers 220a. In addition, group III-V fins 217 (which include channel region 255b) extend up from insulator layer 204 of NMOS region 240 to define n-channel layers 220b, except that germanium seed layers 208 are between the group III-V fins 217 and insulator layer 204, as shown.

As can be further seen in this example embodiment, a common high-k gate dielectric 282 is disposed over all channel layers 220 and the underlying insulator layer 204. Recall in other embodiments that the gate dielectric used for PMOS devices is compositionally and/or geometrically different from the gate dielectric used for NMOS devices. A PMOS work function material 283a is disposed on the gate dielectric 282 in the channel regions 255a of the PMOS region 240, and an NMOS work function material 283b is disposed on the gate dielectric 282 in the channel regions 255b of the NMOS region 242. Any of the previous mentioned example work function materials can be used, although others will be apparent, as will be appreciated. A common gate metal (such as tungsten or aluminum) is then provided on the work function metal layers 283a-b to provide or otherwise complete the gate electrode 284. Recall that in some embodiments, the work function material 283a-b may be considered part of the gate electrode structure 284.

An example of nanowire channel regions 255a-b is illustrated in FIG. 14A, where the gate dielectric 282 and work function 283a-b (or gate electrodes 284, as the case may be) completely surround the respective channel regions 255a-b. As can be seen in this example embodiment, a remnant of the germanium seed layer 208 remains on the bottom of the group III-V material channel regions 255b. FIG. 14B illustrates another example embodiment of a gate-all-around structure of p-channel layers 220a in PMOS region 240 and n-channel layers 220b in NMOS region 242. This embodiment is similar to that shown in FIG. 14A, except that the germanium seed layer 208 is completely or otherwise substantially removed from the bottom of the group III-V material channel regions 255b. In either of FIGS. 14A-B, note that the germanium fins 207 have been liberated from the underlying insulator layer 204 (e.g., by etching the insulator layer 204, as previously explained) to define a nanowire or nanoribbon or beaded fin channel region 255 as previously discussed with reference to FIG. 10. Further note that the diverse fin types exist in a common plane, such that an imaginary horizontal line passes through both types of fins 207 and 217. Further recall that in any such embodiments, that the germanium seed layer 208 may remain in the S/D drain regions 270b, as shown in FIGS. 12A-B.

As previously discussed, n-channel layers 220b may comprise single-crystal III-V material with few or no detectable defects (e.g., dislocation faults), and p-channel layers 220a may comprise single-crystal germanium with few or no detectable defects, in accordance with some embodiments. Each channel layer 220a-b material may have a relatively low defect/stacking fault density, such as less than 1E6 per cm$^2$, which is the limit of detection using TEM. In some such embodiments, the channel layers 220a-b material may have a defect/stacking fault density of at most 1E4, 1E5, 1E6, 1E7, 1E8, or 1E19 less than 1E6 per cm$^2$, for example. In some example cases, a given channel regions 255a-b has no defects, or a number of defects that is less than, for instance, 10 defects, or less than 9 defects, or less than 8 defects, or less than 7 defects, or less than 6 defects, or less than 5 defects, or less than 4 defects, or less than 3 defects, or less than 2 defects.

In some embodiments, the lateral length of gate electrode 284 (generally, the lateral distance between spacers 260), is in the range of 3-100 nm or any sub-range thereof (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm), or any other suitable value or range as will be apparent in light of this disclosure.

Variations on the structures shown in FIGS. 13-14B will be apparent. For instance, note that in the example embodiment shown, the PMOS region 240 includes two neighboring fins 207 each including PMOS transistor devices, and the NMOS region 242 includes two neighboring fins 217 each including NMOS transistor devices. Other embodiments may have, for example, an alternating arrangement of PMOS and NMOS fins. For instance, in some such embodiments, a given region 240 or 242 (or both) might include a germanium fin 207 (including a PMOS transistor) next to a group III-V material fin 217 (including an NMOS transistor). This alternating pattern can be repeated as needed over a given substrate. In a more general sense, the arrangement of PMOS and NMOS fins can be set as desired for a given application or circuit layout and the present disclosure is not intended to be limited to any particular such layout or configuration, as will be appreciated.

Example System

Figure 15:
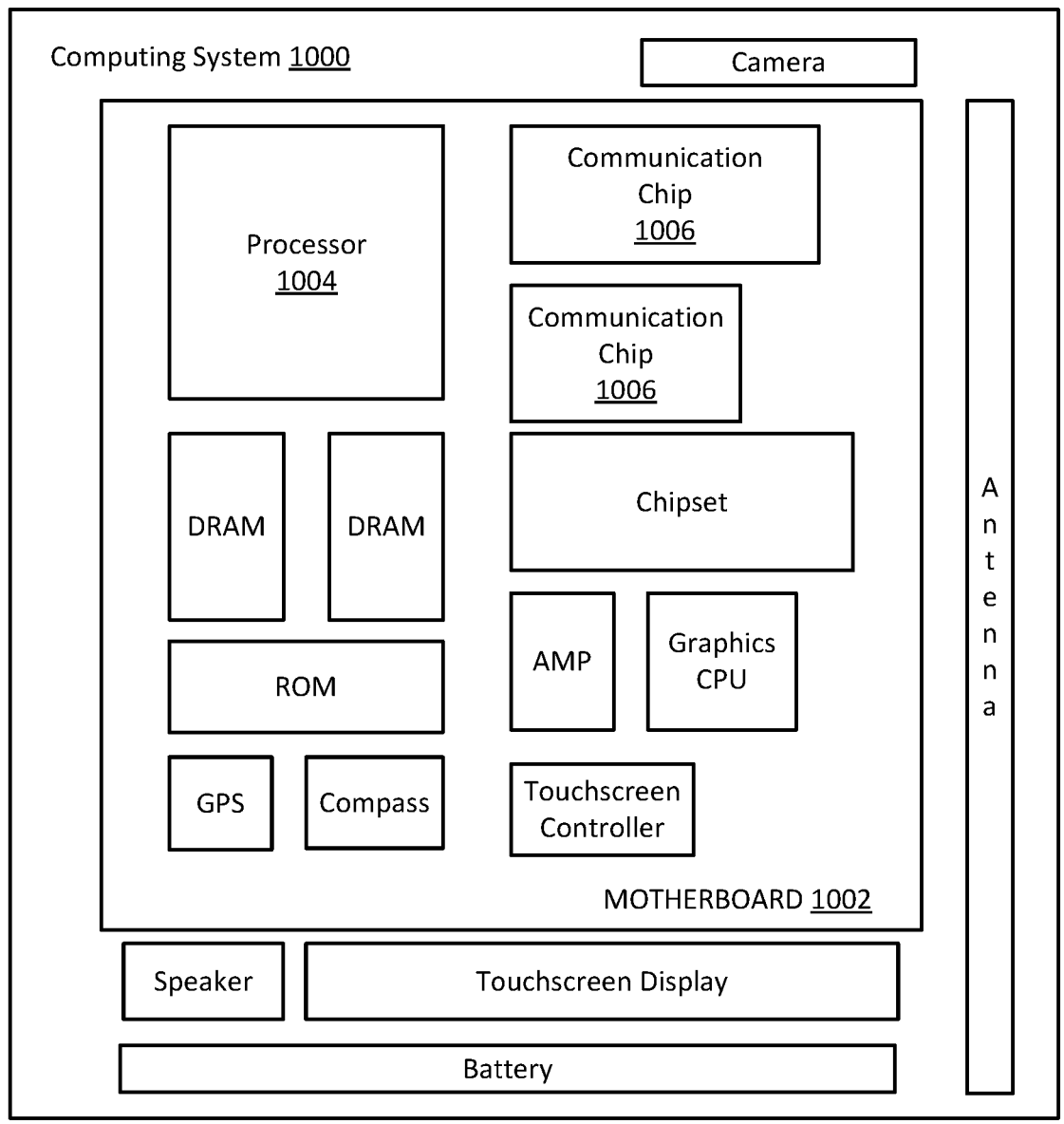
FIG. 15 illustrates an example computing system including integrated circuit structures and/or transistor devices formed, in accordance with some embodiments of the present disclosure.

FIG. 15 illustrates an example computing system 1000 including integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) comprising: a layer of insulation material; a first fin structure above the layer of insulation material, the first fin structure comprising germanium; a second fin structure above the layer of insulation material, the second fin structure comprising a first group III-V semiconductor material, wherein the first and second fin structures exist in a common plane such that an imaginary horizontal line that passes through the first fin structure also passes through the second fin structure; a first gate structure on a portion of the first fin structure, the first gate structure including a first gate electrode and a first gate dielectric, the first gate dielectric being between the portion of the first fin structure and the first gate electrode; a second gate structure on a portion of the second fin structure, the second gate structure including a second gate electrode and a second gate dielectric, the second gate dielectric being between the portion of the second fin structure and the second gate electrode; a first source or drain region above the layer of insulation material and laterally adjacent to the portion of the first fin structure, the first source or drain region comprising a p-type impurity and at least one of silicon or germanium; a second source or drain region above the layer of insulation material and laterally adjacent to the portion of the second fin structure, the second source or drain region comprising an n-type impurity and a second group III-V semiconductor material; and a layer comprising germanium between the layer of insulation material and the second source or drain region.

Example 2 includes the subject matter of Example 1, wherein the layer comprising germanium is part of the second fin structure.

Example 3 includes the subject matter of Example 1 or 2, wherein at least part of the layer comprising germanium is under the second gate structure and in contact with the first group III-V semiconductor material.

Example 4 includes the subject matter of any of Examples 1-3, wherein at least part of the first gate structure surrounds the portion of the first fin structure.

Example 5 includes the subject matter of any of Examples 1-4, wherein the first gate dielectric and a p-type metal of the first gate structure surround the portion of the first fin structure.

Example 6 includes the subject matter of any of Examples 1-5, wherein at least part of the second gate structure surrounds the portion of the second fin structure.

Example 7 includes the subject matter of Example 6, wherein the second gate dielectric and an n-type metal of second gate structure surround the portion of the second fin structure.

Example 8 includes the subject matter of any of Examples 1-7, wherein the first gate dielectric and the second gate dielectric are compositionally different, geometrically different, or both compositionally and geometrically different.

Example 9 includes the subject matter of any of Examples 1-8, wherein the first gate dielectric is on the portion of the first fin structure as well as the layer of insulation material under the portion of the first fin structure, and the second gate dielectric is on the portion of the second fin structure as well as the layer of insulation material under the portion of the second fin structure.

Example 10 includes the subject matter of any of Examples 1-9, wherein the first gate electrode includes p-type metal, and the second gate electrode includes n-type metal.

Example 11 includes the subject matter of any of Examples 1-10, wherein the first group III-V semiconductor material is compositionally different from the second group III-V semiconductor material.

Example 12 includes the subject matter of any of Examples 1-11, wherein the layer of insulation material is on a bulk silicon substrate.

Example 13 includes the subject matter of any of Examples 1-12, wherein the germanium concentration of the first fin structure is greater than 75 atomic percent.

Example 14 includes the subject matter of Example 13, wherein the germanium concentration of the first fin structure is greater than 95 atomic percent.

Example 15 includes the subject matter of any of Examples 1-14, wherein the first group III-V semiconductor material and the layer comprising germanium have a lattice mismatch no greater than 4%.

Example 16 includes the subject matter of any of Examples 1-15, wherein the first and second group III-V semiconductor materials each comprises two or more of gallium, arsenic, indium, and phosphorous.

Example 17 includes the subject matter of any of Examples 1-16, wherein the first group III-V semiconductor material has a defect density no greater than 1E8 per $cm^2$.

Example 18 includes the subject matter of Example 17, wherein the defect density is no greater than 1E6 per $cm^2$.

Example 19 is an integrated circuit (IC) comprising: a layer of insulation material, the insulation material comprising silicon and oxygen; a first fin structure above the layer of insulation material, the first fin structure comprising a body of germanium; a second fin structure above the layer of insulation material, the second fin structure comprising a body of first group III-V semiconductor material, wherein the first and second fin structures exist in a common plane such that an imaginary horizontal line that passes through the first fin structure also passes through the second fin structure; a first gate structure on a portion of the first fin structure, the first gate structure including a first gate electrode and a first gate dielectric, the first gate dielectric being between the portion of the first fin structure and the first gate electrode, wherein at least part of the first gate structure surrounds the portion of the first fin structure, and wherein the first gate dielectric is on the portion of the first fin structure as well as the layer of insulation material under the portion of the first fin structure; a second gate structure on a portion of the second fin structure, the second gate structure including a second gate electrode and a second gate dielectric, the second gate dielectric being between the portion of the second fin structure and the second gate electrode, wherein at least part of the second gate structure surrounds the portion of the second fin structure, and wherein the second gate dielectric is on the portion of the second fin structure as well as the layer of insulation material under the portion of the second fin structure; a first source or drain region above the layer of insulation material and laterally adjacent to the portion of the first fin structure, the first source or drain region comprising a p-type impurity and at least one of silicon or germanium; a second source or drain region above the layer of insulation material and laterally adjacent to the portion of the second fin structure, the second source or drain region comprising an n-type impurity and a second group III-V semiconductor material, wherein the first group III-V semiconductor material is compositionally different from the second group III-V semiconductor material; and a layer comprising germanium between the layer of insulation material and the second source or drain region.

Example 20 includes the subject matter of Example 19, wherein the layer comprising germanium is part of the second fin structure.

Example 21 includes the subject matter of Example 19 or 20, wherein at least part of the layer comprising germanium is under the second gate structure and in contact with the body of the first group III-V semiconductor material.

Example 22 includes the subject matter of any of Examples 19-21, wherein the first gate dielectric and a p-type metal of first gate structure surround the portion of the first fin structure.

Example 23 includes the subject matter of any of Examples 19-22, wherein the second gate dielectric and an n-type metal of second gate structure surround the portion of the second fin structure.

Example 24 includes the subject matter of any of Examples 19-23, wherein the first gate dielectric and the second gate dielectric are compositionally different, geometrically different, or both compositionally and geometrically different.

Example 25 includes the subject matter of any of Examples 19-24, wherein the first gate electrode includes p-type metal, and the second gate electrode includes n-type metal.

Example 26 includes the subject matter of any of Examples 19-25, wherein the layer of insulation material is on a bulk silicon substrate.

Example 27 includes the subject matter of any of Examples 19-26, wherein the first group III-V semiconductor material and the layer comprising germanium have a lattice mismatch no greater than 4%.

Example 28 includes the subject matter of any of Examples 19-27, wherein the first and second group III-V semiconductor materials each comprises two or more of gallium, arsenic, indium, and phosphorous.

Example 29 includes the subject matter of any of Examples 19-28, wherein the first group III-V semiconductor material has a defect density no greater than 1E8 per $cm^2$.

Example 30 includes the subject matter of Example 29, wherein the defect density is no greater than 1E6 per $cm^2$.

Example 31 is a method for forming an integrated circuit, the method comprising: providing a layer of insulation material; providing a first fin structure above the layer of insulation material, the first fin structure comprising germanium; providing a second fin structure above the layer of insulation material, the second fin structure comprising a first group III-V semiconductor material, wherein the first and second fin structures exist in a common plane such that an imaginary horizontal line that passes through the first fin structure also passes through the second fin structure; providing a first gate structure on a portion of the first fin structure, the first gate structure including a first gate electrode and a first gate dielectric, the first gate dielectric being between the portion of the first fin structure and the first gate electrode; providing a second gate structure on a portion of the second fin structure, the second gate structure including a second gate electrode and a second gate dielectric, the second gate dielectric being between the portion of the second fin structure and the second gate electrode; providing a first source or drain region above the layer of insulation material and laterally adjacent to the portion of the first fin structure, the first source or drain region comprising a p-type impurity and at least one of silicon or germanium; providing a second source or drain region above the layer of insulation material and laterally adjacent to the portion of the second fin structure, the second source or drain region comprising an n-type impurity and a second group III-V semiconductor material; and providing a layer comprising germanium between the layer of insulation material and the second source or drain region.

Example 32 includes the subject matter of Example 31, wherein the layer comprising germanium is part of the second fin structure.

Example 33 includes the subject matter of Example 31 or 32, wherein at least part of the layer comprising germanium is under the second gate structure and in contact with the first group III-V semiconductor material.

Example 34 includes the subject matter of Example 33, wherein the first gate dielectric and a p-type metal of first gate structure surround the portion of the first fin structure.

Example 35 includes the subject matter of any of Examples 31-33, wherein at least part of the first gate structure surrounds the portion of the first fin structure.

Example 36 includes the subject matter of any of Examples 31-35, wherein at least part of the second gate structure surrounds the portion of the second fin structure.

Example 37 includes the subject matter of Example 36, wherein the second gate dielectric and an n-type metal of second gate structure surround the portion of the second fin structure.

Example 38 includes the subject matter of any of Examples 31-37, wherein the first gate dielectric and the second gate dielectric are compositionally different, geometrically different, or both compositionally and geometrically different.

Example 39 includes the subject matter of any of Examples 31-38, wherein the first gate dielectric is on the portion of the first fin structure as well as the layer of insulation material under the portion of the first fin structure, and the second gate dielectric is on the portion of the second fin structure as well as the layer of insulation material under the portion of the second fin structure.

Example 40 includes the subject matter of any of Examples 31-39, wherein the first gate electrode includes p-type metal, and the second gate electrode includes n-type metal.

Example 41 includes the subject matter of any of Examples 31-40, wherein the first group III-V semiconductor material is compositionally different from the second group III-V semiconductor material.

Example 42 includes the subject matter of any of Examples 31-41, wherein the layer of insulation material is on a bulk silicon substrate.

Example 43 includes the subject matter of any of Examples 31-42, wherein the germanium concentration of the first fin structure is greater than 75 atomic percent.

Example 44 includes the subject matter of Example 43, wherein the germanium concentration of the first fin structure is greater than 95 atomic percent.

Example 45 includes the subject matter of any of Examples 31-44, wherein the first group III-V semiconductor material and the layer comprising germanium have a lattice mismatch no greater than 4%.

Example 46 includes the subject matter of any of Examples 31-45, wherein the first and second group III-V semiconductor materials each comprises two or more of gallium, arsenic, indium, and phosphorous.

Example 47 includes the subject matter of any of Examples 31-46, wherein the first group III-V semiconductor material has a defect density no greater than 1E8 per $cm^2$.

Example 48 includes the subject matter of Example 47, wherein the defect density is no greater than 1E6 per $cm^2$.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) comprising:
    a layer of insulation material;
    a first fin structure directly on the layer of insulation material, the first fin structure comprising germanium;
    a second fin structure directly on the layer of insulation material, the second fin structure comprising a first group III-V semiconductor material, wherein the first and second fin structures exist in a common plane such that an imaginary horizontal line that passes through the first fin structure also passes through the second fin structure;
    a first gate structure on a portion of the first fin structure, the first gate structure including a first gate electrode and a first gate dielectric, the first gate dielectric being between the portion of the first fin structure and the first gate electrode;
    a second gate structure on a portion of the second fin structure, the second gate structure including a second gate electrode and a second gate dielectric, the second gate dielectric being between the portion of the second fin structure and the second gate electrode;
    a first source or drain region above the layer of insulation material and laterally adjacent to the portion of the first fin structure, the first source or drain region comprising a p-type impurity and at least one of silicon or germanium;
    a second source or drain region above the layer of insulation material and laterally adjacent to the portion of the second fin structure, the second source or drain region comprising an n-type impurity and a second group III-V semiconductor material, wherein the second group III-V semiconductor material has a different semiconductor composition than the first group III-V semiconductor material; and a layer comprising germanium between the layer of insulation material and the second source or drain region.

2. The IC of claim 1, wherein the layer comprising germanium is part of the second fin structure.

3. The IC of claim 1, wherein at least part of the layer comprising germanium is under the second gate structure and in contact with the first group III-V semiconductor material.

4. The IC of claim 1, wherein at least part of the first gate structure surrounds the portion of the first fin structure.

5. The IC of claim 4, wherein the first gate dielectric and a p-type metal of first gate structure surround the portion of the first fin structure.

6. The IC of claim 1, wherein at least part of the second gate structure surrounds the portion of the second fin structure.

7. The IC of claim 6, wherein the second gate dielectric and an n-type metal of second gate structure surround the portion of the second fin structure.

8. The IC of claim 1, wherein the first gate dielectric and the second gate dielectric are compositionally different, geometrically different, or both compositionally and geometrically different.

9. The IC of claim 1, wherein the first gate dielectric is on the portion of the first fin structure as well as the layer of insulation material under the portion of the first fin structure, and the second gate dielectric is on the portion of the second fin structure as well as the layer of insulation material under the portion of the second fin structure.

10. The IC of claim 1, wherein the first gate electrode includes p-type metal, and the second gate electrode includes n-type metal.

11. The IC of claim 1, wherein the germanium concentration of the first fin structure is greater than 75 atomic percent, and the first and second group III-V semiconductor materials each comprises two or more of gallium, arsenic, indium, and phosphorous.

12. The IC of claim 1, wherein the first group III-V semiconductor material and the layer comprising germanium have a lattice mismatch no greater than 4%.

13. An integrated circuit (IC) comprising:
a layer of insulation material, the insulation material comprising silicon and oxygen;
a first fin structure above the layer of insulation material, the first fin structure comprising a body of germanium;
a second fin structure above the layer of insulation material, the second fin structure comprising a body of first group III-V semiconductor material, wherein the first and second fin structures exist in a common plane such that an imaginary horizontal line that passes through the first fin structure also passes through the second fin structure;
a first gate structure on a portion of the first fin structure, the first gate structure including a first gate electrode and a first gate dielectric, the first gate dielectric being between the portion of the first fin structure and the first gate electrode, wherein at least part of the first gate structure surrounds the portion of the first fin structure, and wherein the first gate dielectric is on the portion of the first fin structure as well as the layer of insulation material under the portion of the first fin structure;
a second gate structure on a portion of the second fin structure, the second gate structure including a second gate electrode and a second gate dielectric, the second gate dielectric being between the portion of the second fin structure and the second gate electrode, wherein at least part of the second gate structure surrounds the portion of the second fin structure, and wherein the second gate dielectric is on the portion of the second fin structure as well as the layer of insulation material under the portion of the second fin structure;
a first source or drain region above the layer of insulation material and laterally adjacent to the portion of the first fin structure, the first source or drain region comprising a p-type impurity and at least one of silicon or germanium;
a second source or drain region above the layer of insulation material and laterally adjacent to the portion of the second fin structure, the second source or drain region comprising an n-type impurity and a second group III-V semiconductor material, wherein the first group III-V semiconductor material has a different semiconductor composition than the second group III-V semiconductor material; and
a layer comprising germanium between the layer of insulation material and the second source or drain region.

14. The IC of claim 13, wherein the layer comprising germanium is part of the second fin structure, and/or at least part of the layer comprising germanium is under the second gate structure and in contact with the body of the first group III-V semiconductor material.

15. The IC of claim 13, wherein the first gate dielectric and a p-type metal of first gate structure surround the portion of the first fin structure, and/or the second gate dielectric and an n-type metal of second gate structure surround the portion of the second fin structure.

16. An integrated circuit (IC) comprising:
a layer of insulation material;
a first fin structure directly on the layer of insulation material, the first fin structure comprising germanium;
a second fin structure directly on the layer of insulation material, the second fin structure comprising a group III-V semiconductor material and a layer comprising germanium between the group III-V semiconductor material and the layer of insulation material, and wherein the first and second fin structures exist in a common plane such that an imaginary horizontal line that passes through the first fin structure also passes through the second fin structure;
a first gate structure on a portion of the first fin structure, the portion of the first fin structure including the germanium, wherein the first gate structure includes a first gate electrode and a first gate dielectric, the first gate dielectric being between the germanium-containing portion of the first fin structure and the first gate electrode;
a second gate structure on a portion of the second fin structure, the portion of the second fin structure including the group III-V semiconductor material, wherein the second gate structure includes a second gate electrode and a second gate dielectric, the second gate dielectric being between the portion of the second fin structure and the second gate electrode;
a first source or drain region above the layer of insulation material and laterally adjacent to the portion of the first fin structure; and
a second source or drain region above the layer of insulation material and laterally adjacent to the portion of the second fin structure, the second source or drain region comprising a second group III-V semiconductor material, wherein the second group III-V semiconductor material has a different semiconductor composition than the group III-V semiconductor material.

17. The IC of claim 16, wherein:

the first gate structure wraps around the portion of the first fin structure, and the first gate dielectric is on the portion of the first fin structure as well as the layer of insulation material under the portion of the first fin structure; and the second gate structure wraps around the portion of the second fin structure, and the second gate dielectric is on the portion of the second fin structure as well as the layer of insulation material under the portion of the second fin structure.

18. The IC of claim 16, wherein the first gate dielectric and the second gate dielectric both include a high-k dielectric material, and the high-k dielectric material of the first gate dielectric is the same as the high-k dielectric material of the second high-k gate dielectric.

19. An integrated circuit (IC) comprising:

a layer of insulation material;

a first fin structure above the layer of insulation material, the first fin structure comprising germanium;

a second fin structure above the layer of insulation material, the second fin structure comprising a first group III-V semiconductor material, wherein the first and second fin structures exist in a common plane such that an imaginary horizontal line that passes through the first fin structure also passes through the second fin structure;

a first gate structure on a portion of the first fin structure, the first gate structure including a first gate electrode and a first gate dielectric, the first gate dielectric being between the portion of the first fin structure and the first gate electrode;

a second gate structure on a portion of the second fin structure, the second gate structure including a second gate electrode and a second gate dielectric, the second gate dielectric being between the portion of the second fin structure and the second gate electrode;

a first source or drain region above the layer of insulation material and laterally adjacent to the portion of the first fin structure, the first source or drain region comprising a p-type impurity and at least one of silicon or germanium;

a second source or drain region above the layer of insulation material and laterally adjacent to the portion of the second fin structure, the second source or drain region comprising an n-type impurity and a second group III-V semiconductor material, wherein the second group III-V semiconductor material has a different semiconductor composition than the first group III-V semiconductor material; and a layer comprising germanium between the layer of insulation material and the second source or drain region, wherein the first gate dielectric is on the portion of the first fin structure as well as the layer of insulation material under the portion of the first fin structure, and the second gate dielectric is on the portion of the second fin structure as well as the layer of insulation material under the portion of the second fin structure.

* * * * *